(12) United States Patent
Hill

(10) Patent No.: US 7,268,888 B2
(45) Date of Patent: Sep. 11, 2007

(54) COMPENSATION OF REFRACTIVITY PERTURBATIONS IN AN INTERFEROMETER PATH

(75) Inventor: Henry A. Hill, Tucson, AZ (US)

(73) Assignee: Zygo Corporation, Middlefield, CT (US)

(*) Notice: Subject to any disclaimer, the term of this patent is extended or adjusted under 35 U.S.C. 154(b) by 256 days.

(21) Appl. No.: 10/701,759

(22) Filed: Nov. 4, 2003

(65) Prior Publication Data

US 2004/0141185 A1    Jul. 22, 2004

Related U.S. Application Data

(60) Provisional application No. 60/423,562, filed on Nov. 4, 2002.

(51) Int. Cl.
*G01B 11/02* (2006.01)
*G01N 21/41* (2006.01)

(52) U.S. Cl. ................................ 356/500; 356/517

(58) Field of Classification Search ................ 356/486, 356/487, 493, 498, 500, 517; 250/559.29, 250/559.3
See application file for complete search history.

(56) References Cited

U.S. PATENT DOCUMENTS

| | | | |
|---|---|---|---|
| 4,948,254 A | 8/1990 | Ishida | |
| 5,114,234 A | 5/1992 | Otsuka | |
| 5,404,222 A | 4/1995 | Lis | |
| 5,408,318 A | 4/1995 | Slater | |
| 5,483,343 A | 1/1996 | Iwamoto et al. | |
| 5,491,550 A | 2/1996 | Dabbs | |
| 5,715,057 A | 2/1998 | Bechstein et al. | |
| 5,757,160 A | 5/1998 | Kreuzer | |
| 5,757,489 A | 5/1998 | Kawakami | 356/349 |
| 5,764,361 A | 6/1998 | Kato et al. | |
| 5,764,362 A | 6/1998 | Hill et al. | |
| 5,801,832 A | 9/1998 | Van Den Brink | |
| 5,877,843 A | 3/1999 | Takagi et al. | |
| 5,991,033 A | 11/1999 | Henshaw et al. | |
| 6,020,964 A | 2/2000 | Loopstra | |
| 6,040,096 A | 3/2000 | Kakizaki | |
| 6,046,792 A | 4/2000 | Van Der Werf | |
| 6,134,007 A | 10/2000 | Naraki | |
| 6,160,619 A | 12/2000 | Magome | |
| 6,219,144 B1 | 4/2001 | Hill et al. | 356/487 |
| 6,304,382 B1 | 10/2001 | Simon | |
| 6,327,039 B1 | 12/2001 | de Groot et al. | |

(Continued)

OTHER PUBLICATIONS

Norman Bobroff, "Residual errors in laser interferometry from air turbulence and nonlinearity", *Applied Optics*, vol. 26, No. 13, pp. 2676-2682 (Jul. 1, 1987).

(Continued)

*Primary Examiner*—Jonathan Skovholt
(74) *Attorney, Agent, or Firm*—Fish & Richardson P.C.

(57) ABSTRACT

In general, in one aspect, the invention features a method that includes directing a first measurement beam along a first path contacting a measurement object to determine a first interferometric phase related to a position of a measurement object, directing a second measurement beam along a second path contacting the measurement object to determine an second interferometric phase related to the position of the measurement object, and determining a contribution to the first interferometric phase due to perturbations in refractivity along the first path based on the second interferometric phase.

64 Claims, 8 Drawing Sheets

U.S. PATENT DOCUMENTS

| | | |
|---|---|---|
| 6,330,065 B1 | 12/2001 | Hill |
| 6,417,927 B2 | 7/2002 | de Groot |
| 6,541,759 B1 | 4/2003 | Hill |
| 6,839,141 B2 | 1/2005 | Hill |
| 6,842,256 B2 | 1/2005 | Hill |
| 2002/0001086 A1 | 1/2002 | de Groot .................. 356/486 |
| 2002/0048026 A1 | 4/2002 | Isshiki et al. |
| 2006/0256346 A1 | 11/2006 | Hill |

OTHER PUBLICATIONS

Bennett, S.J. "A double-passed michelson interferometer." Optics Communications, 4:6, pp. 428.430, 1972.

Bobroff, N. "Recent advances in displacement measureing interferometry." Meas. Sci. Technol. 4, pp. 907-926, 1993.

Oka, K. et al. "Polarization heterodyne interferometry using another local oscillator beam." Optics Communication, 92, pp. 1-5, 1992.

COMPENSATION OF REFRACTIVITY PERTURBATIONS IN AN INTERFEROMETER PATH

CROSS-REFERENCE TO RELATED APPLICATIONS

This application claims priority to Provisional Patent Application 60/423,562, entitled "COMPENSATION OF TURBULENT EFFECTS OF GAS IN A MEASUREMENT PATH OF AN INTERFEROMETER," filed on Nov. 4, 2002, the entire contents of which are hereby incorporated by reference.

BACKGROUND

Displacement measuring interferometers monitor changes in the position of a measurement object (e.g., a plane mirror or retroreflector) relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam splitter to direct the measurement and reference beams to the measurement and reference objects, respectively, and combine the reflected measurement and reference beams to form overlapping exit measurement and reference beams. The overlapping exit beams form an output beam that subsequently passes through a polarizer.

The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths vary relative to one another (e.g., by translating a stage that includes the measurement object), the measured beat frequency includes a Doppler shift equal to $2vnp/\lambda$, where $v$ is the relative speed of the measurement and reference objects, $\lambda$ is the wavelength of the measurement and reference beams, $n$ is the refractive index of the medium through which the light beams travel (e.g., air or vacuum), and $p$ is the number of passes to the reference and measurement objects. Changes in the relative position of the measurement object correspond to changes in the phase of the measured interference signal, with a $2\pi$ phase change substantially equal to a distance change L of $\lambda(np)$, where L is a round-trip distance change (e.g., the change in distance to and from a stage that includes the measurement object).

Unfortunately, this equality is not always exact. In addition, the amplitude of the measured interference signal may be variable. A variable amplitude may subsequently reduce the accuracy of measured phase changes. Many interferometers include non-linearities such as so-called "cyclic errors." The cyclic errors can be expressed as contributions to the phase and/or the intensity of the measured interference signal that have a sinusoidal dependence on the change in optical path length pnL. In particular, the first harmonic cyclic error in phase has a sinusoidal dependence on $(2\pi pnL)/\lambda$ and the second harmonic cyclic error in phase has a sinusoidal dependence on $2(2\pi pnL)/\lambda$. Higher harmonic cyclic errors can also be present.

Another source of errors is related to environmental effects such as gas turbulence. Interferometric displacement measurements in a gas are subject to environmental uncertainties, particularly to changes in air pressure and temperature; to uncertainties in gas composition such as resulting from changes in humidity; and to the effects of turbulence in the gas. Such factors alter the wavelength of the light used to measure the displacement. Under normal conditions the refractive index of air, for example, is approximately 1.0003 with a variation of the order of $1\times10^{-5}$ to $1\times10^{-4}$. In many applications, the refractive index of air should be known with a relative precision of less than 0.1 ppm (parts per million) to less than 0.001 ppm, these two relative precisions corresponding to a displacement measurement accuracy of 100 nm and less than 1 nm, respectively, for a one meter interferometric displacement measurement. For discussion of environmental uncertainties, see, for example, the article entitled "Residual Errors In Laser Interferometry From Air Turbulence And Nonlinearity," by N. Bobroff, Appl. Opt. 26(13), 2676-2682 (1987), and the article entitled "Recent Advances In Displacement Measuring Interferometry," also by N. Bobroff, Measurement Science & Tech. 4(9), 907-926 (1993).

One way to detect refractive index fluctuations is to measure changes in pressure and temperature along a measurement path and calculate the effect on the optical path length of the measurement path. Examples of mathematical equations for effecting such a calculation are disclosed in an article entitled "The Refractivity Of Air," by F. E. Jones, J. Res. NBS 86(1), 27-32 (1981). An implementation of the technique is described in an article entitled "High-Accuracy Displacement Interferometry In Air," by W. T. Estler, Appl. Opt. 24(6), 808-815 (1985).

Another, more direct way to detect the effects of a fluctuating refractive index over a measurement path is by multiple-wavelength distance measurement. The basic principle may be understood as follows. Interferometers and laser radar measure the optical path length between a reference and an object, most often in open air. The optical path length is the integrated product of the refractive index and the physical path traversed by a measurement beam. In that the refractive index varies with wavelength, but the physical path is independent of wavelength, it is generally possible to determine the physical path length from the optical path length, particularly the contributions of fluctuations in refractive index, provided that the instrument employs at least two wavelengths. The variation of refractive index with wavelength is known in the art as dispersion and this technique is often referred to as the dispersion technique.

An example of a two wavelength distance measurement system is described in an article by Y. Zhu, H. Matsumoto, T. O'ishi, SPIE 1319, Optics in Complex Systems, 538-539 (1990), entitled "Long-Arm Two-Color Interferometer For Measuring The Change Of Air Refractive Index." The system of Zhu et al. employs a 1064 nm wavelength YAG laser and a 632 nm HeNe laser together with quadrature phase detection. A similar instrument is described in Japanese in an earlier article by Zhu et al. entitled "Measurement Of Atmospheric Phase And Intensity Turbulence For Long-Path Distance Interferometer," Proc. 3$^{rd}$ Meeting On Lightwave Sensing Technology, *Appl. Phys. Soc. of Japan,* 39 (1989).

Interferometers utilizing the dispersion technique are can be included as components of scanner systems and stepper systems used in lithography to produce integrated circuits on semiconductor wafers. Such lithography systems typically include a translatable stage to support and fix the wafer, focusing optics used to direct a radiation beam onto the wafer, a scanner or stepper system for translating the stage relative to the exposure beam, and one or more interferometers. Each interferometer directs a measurement beam to, and receives a reflected measurement beam from, a plane mirror attached to the stage. Each interferometer interferes its reflected measurement beams with a corresponding reference beam, and collectively the interferometers accurately measure changes in the position of the stage relative to the radiation beam. The interferometers enable the lithography system to precisely control which regions of the wafer are exposed to the radiation beam.

SUMMARY

Perturbations in the local refractivity of a gas body can be caused by local variations in gas composition and/or density, such as those variations caused by gas turbulence. When occurring in the path of an interferometer measurement beam, such variations cause variations in the optical path length of the measurement beam, and hence affect a phase measured by the interferometer. Local variations in gas composition and/or density therefore are a source of error in measurements made with an interferometer.

Phase measurements made using a multi-axis interferometer can be used to determine a contribution of refractivity perturbations to the phase measurements. Where a multi-axis interferometer includes two substantially parallel measurement axes, and the measurement axes are substantially orthogonal to an average gas flow direction, similar refractivity perturbations are experienced by measurement beams directed along the first and second measurement axes. An upstream measurement beam experiences a given refractivity perturbation first, and the downstream measurement beam experiences the refractivity perturbation at time, $\tau$, later. The time, $\tau$, is related to the average gas velocity and the distance separating the two measurement paths.

Each phase value, $\tilde{\phi}$, monitored by an interferometer includes a contribution, $\zeta$, due to perturbations in the refractivity of gas in the measurement beam in addition to other contributions (e.g., due to the variations in the orientation of the measurement object and/or due to variations in the refractivity of the gas that changes over longer time periods). Here, the tilde indicates an observable parameter. Due to the random nature of the refractivity perturbations, the net effect of all the perturbations ultimately sums to zero. Accordingly, in a multi-axis interferometer, the contribution to a phase measurement, $\tilde{\phi}_A$, made at a time, $t_0$, can be determined according to a function of the phase measurements $\tilde{\phi}_A$ and $\tilde{\phi}_B$ at $t_0$ and/or at different times, where A and B correspond to two different measurement axes. In other words, $$\zeta_A(t_0) = F(\tilde{\phi}_A, \tilde{\phi}_B). \tag{1}$$

This relationship assumes that other contributions to the phase are known or otherwise compensated. In some embodiments, $$\zeta_A(t_0) = F'(\tilde{\phi}_A - \tilde{\phi}_B). \tag{2}$$

For example, where $\tilde{\phi}_A - \tilde{\phi}_B \propto \zeta_A - \zeta_B$, the contribution of refractivity perturbations can be determined using a filter, which utilizes the relationship:

$$\sum_{p=1}^{N} \left(\frac{N-p+1}{N}\right)[\tilde{\phi}_A(t_{-p}) - \tilde{\phi}_B(t_{-p})] \propto \tag{3}$$

$$\sum_{p=1}^{N} \left(\frac{N-p+1}{N}\right)[\zeta_A(t_{-p}) - \zeta_B(t_{-p})].$$

Here, the subscript B refers to the upstream interferometer axis and A refers to the downstream interferometer axis. N is an integer. Furthermore, $$t_{-1} = t_0 - \tau$$

$$t_{-2} = t_0 - 2\tau$$

$$t_{-N} = t_0 - N\tau \tag{4}$$

Because, the perturbation is experienced by both measurement beams, the phase contribution of the upstream measurement can be rewritten in terms of the downstream measurement as $$\zeta_B(t_{-p}) = \zeta_A(t_{-p} + \tau) = \zeta_A(t_{-p+1}). \tag{5}$$

Thus, the right hand side of Equation (3) can be rewritten as $$\sum_{p=1}^{N} \left(\frac{N-p+1}{N}\right)[\zeta_A(t_{-p}) - \zeta_B(t_{-p})] = -\zeta_A(t_0) + \frac{1}{N}\sum_{p=1}^{N} \zeta_A(t_{-p}). \tag{6}$$

However, because the refractivity perturbations are due to random effects, their mean value should be approximately zero. Thus, for sufficiently large N (e.g., N>10), $$\frac{1}{N}\sum_{p=1}^{N} \zeta_A(t_{-p}) \approx 0. \tag{7}$$

Therefore, $$\zeta_A(t_0) \propto -\sum_{p=1}^{N} \left(\frac{N-p+1}{N}\right)[\tilde{\phi}_A(t_{-p}) - \tilde{\phi}_B(t_{-p})]. \tag{8}$$

Assuming that other contributions to $\tilde{\phi}_A(t) - \tilde{\phi}_B(t)$ are negligible, $$\zeta_A(t_0) \approx -\frac{1}{4k}\sum_{p=1}^{N} \left(\frac{N-p+1}{N}\right)[\tilde{\phi}_A(t_{-p}) - \tilde{\phi}_B(t_{-p})]. \tag{9}$$

Where additional contributions to $\tilde{\phi}_A(t) - \tilde{\phi}_B(t)$ are not negligible, Equation (9) can be modified to include these contributions. Sources for such additional contributions can include variations in the orientation angle of the measurement object and/or other contributions to changes in gas refractivity. Variations in the orientation of the measurement object can be monitored using additional measurement axes of the multi-axis interferometer or independently of the multi-axis interferometer. These contributions can be subtracted from $\tilde{\phi}_A(t) - \tilde{\phi}_B(t)$ prior to calculating $\zeta_A(t_0)$.

In some embodiments, variations in the orientation of the measurement object can be monitored interferometrically, such as when using additional axes of the multi-axis interferometer or using another multi-axis interferometer. The axes used to independently monitor the measurement object orientation can be positioned so that refractivity perturbations due to gas turbulence are reduced (e.g., are negligible). For example, the measurement axes of the second multi-axis interferometer can be shielded from flowing gas and/or can be substantially parallel to the average gas flow direction.

Other contributions to changes in gas refractivity include effects due to changes in gas composition and/or density that affect contemporaneous interferometer phase measurements similarly (e.g., changes that occur over time periods $\Box\tau$, and/or changes in gas refractivity that do not sum to zero). These effects may be treated separately from the previously described perturbations because their timescales are different from those of the perturbations. Such changes may be periodic. For example, in embodiments where the interferometer is used to monitor a measurement object during a repetitive process, the changes in the gas composition and/or density can be the same during repeated phases of the systems cycle. One example of this is in a lithography tool, where an exposure cycle is repeated for each wafer processed by the tool. These contributions to phase measurements can be compensated by measuring gas refractivity at a location remote from the measurement beam paths and mapping the measured refractivity to the refractivity of gas in the measurement beam path using a non-trivial function (e.g., more complex than a one-to-one correspondence) based on the system conditions at the time the refractivity measurement was made. Examples of such techniques are described in U.S. patent application Ser. No. 10/294,158, entitled "COMPENSATING FOR EFFECTS OF VARIATIONS IN GAS REFRACTIVITY IN INTERFEROMETERS," filed Nov. 11, 2002, the entire contents of which is incorporated herein by reference.

In some embodiments, $\tau$ can vary as a function of time and/or as a function of position along the measurement beam paths. $\tau$ can be selected to reduce (e.g., minimize) errors due to variations of $\tau$ along the length of the measurement beam paths.

In some embodiments, the contribution to an interference phase measurement from refractivity perturbations can be determined from $\tilde{\phi}_A - \tilde{\phi}_B$ according to an integral expression for $\zeta_A(t)$.

Phase measurements can be compensated for the effects of refractivity perturbations in a contemporaneous or non-contemporaneous mode of operation. In a contemporaneous mode of operation, phase measurements are compensated as they are made. A contemporaneous mode of operation is useful where the phase information is immediately utilized by the system, e.g., as a feedback signal. In a non-contemporaneous mode of operation, phase measurements are compensated later from when they were made. Phase measurements may be compensated in an off-line analysis; at some time unrelated to the time the measurements were made.

The methods used for determining contributions to an interference phase measurement from refractivity perturbations can be adapted to other relationships between measurement beam paths. For example, the methods may be adapted for multi-axis interferometer systems where different portions of measurement beam paths are displaced from each other by different amounts (e.g., such as multi-axis interferometer systems utilizing a retroreflector as a measurement object).

The techniques may be used to monitor components in lithography tools.

In general, in a first aspect, the invention features a method that includes directing a first measurement beam along a first path contacting a measurement object to determine a first interferometric phase related to a position of a measurement object, directing a second measurement beam along a second path contacting the measurement object to determine an second interferometric phase related to the position of the measurement object, and determining a contribution to the first interferometric phase due to perturbations in refractivity along the first path based on the second interferometric phase.

Implementations of the method may include one or more of the following features, or features of other aspects.

The contribution to the first interferometric phase due to perturbations in refractivity at a first time can be related to a contribution to the second interferometric phase due to perturbations in refractivity at a second time different from the first time. A difference between the first time and the second time can be related to a velocity of a gas in the first path. The position of the measurement object can change from the first time to the second time. In other words, the first and second phases can be determined while the measurement object is moving.

The first path and second path can be non-parallel to a direction of gas flow in the first path. For example, the first path and second path can be substantially parallel. In some embodiments, the first path and second path are substantially orthogonal to the direction of gas flow in the first path.

Determining the contribution to the first interferometric phase due to perturbations in refractivity can include determining a difference between the first interferometric phase and the second interferometric phase. Determining the contribution to the first interferometric phase due to perturbations in refractivity can further include correcting the difference between the first interferometric phase and the second interferometric phase for variations in an angular orientation of the measurement object. In some embodiments, determining the contribution to the first interferometric phase due to perturbations in refractivity further includes summing the differences of first and second interferometric phases determined for different times. The different times can be related to a velocity of a gas in the first path and/or related to a separation between the first path and the second path. A difference between the contribution to the first interferometric phase due to perturbations in refractivity and a contribution to the second interferometric phase due to perturbations in refractivity can be proportional to the difference between the first interferometric phase and the second interferometric phase.

Determining the contribution to the first interferometric phase can further include determining a parameter related to the difference between the contribution to the first interferometric phase and a contribution to the second interferometric phase due to perturbations in refractivity based on the difference between the first interferometric phase and the second interferometric phase. The contribution to the first interferometric phase can be determined based on an integral relationship between the parameter and the contribution. The integral relationship can be based on a Fredholm integral relationship, for example.

The contribution to the first interferometric phase due to perturbations in refractivity can be determined based on variations in the angular orientation of the measurement object. Variations in the angular orientation of the measurement object can be measured simultaneously to determining the first and second interferometric phases. Variations in the angular orientation of the measurement object can be measured using one or more interferometers. The one or more interferometers can direct respective measurement beams along measurement paths substantially non-orthogonal to a gas flow direction. For example, the measurement paths can be substantially parallel to the gas flow direction. The one or more interferometers can include a multi-axis interferometer.

The method can further include compensating the first interferometric phase for contributions due to non-perturbative variations in refractivity. The contribution to the first interferometric phase due to perturbations in refractivity can be determined contemporaneously or non-contemporaneously to determining the first interferometric phase.

In general, in another aspect, the invention features an apparatus, including an interferometry system which during operation directs a first measurement beam along a first path contacting a measurement object and directs a second measurement beam along a second path contacting the measurement object, and an electronic controller which during operation determines a first and second interferometric phase related to a position of the measurement object based on the first and second measurement beams, respectively, and determines a contribution to the first interferometric phase due to perturbations in refractivity along the first path based on the second interferometric phase.

Embodiments of the apparatus can include one or more of the following features and/or features of other aspects.

The interferometry system can include a multi-axis interferometer which during operation directs the first and second measurement beams along the first and second measurement paths. The first path can be substantially parallel to the second path.

The apparatus can further include a gas source which during operation causes gas to flow through the first and second measurement paths. The direction of gas flow can be substantially non-parallel to the first and second measurement paths. The direction of gas flow can be substantially orthogonal to the first and second measurement paths.

During operation, the interferometry system can direct a third measurement beam along a third path to contact a second measurement object (e.g., positioned orthogonal to the first measurement object) and the electronic controller can determine a third phase related to a position of the second measurement object and can monitor variations in an angular orientation of the measurement object based on the third interferometric phase. The third path can be substantially non-parallel to the first path. The third path can be substantially orthogonal to the first path.

The measurement object can be mounted on a stage which is moveable relative to the interferometry system. The measurement object can include a plane mirror and/or a retroreflector.

In another aspect, the invention features a lithography system for use in fabricating integrated circuits on a wafer, the system including a stage for supporting the wafer, an illumination system for imaging spatially patterned radiation onto the wafer, a positioning system for adjusting the position of the stage relative to the imaged radiation, and the foregoing apparatus for monitoring the position of the wafer relative to the imaged radiation.

In a further aspect, the invention features a lithography system for use in fabricating integrated circuits on a wafer, the system including a stage for supporting the wafer, and an illumination system including a radiation source, a mask, a positioning system, a lens assembly, and the foregoing apparatus, wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

In yet a further aspect, the invention features a beam writing system for use in fabricating a lithography mask, the system including a source providing a write beam to pattern a substrate, a stage supporting the substrate, a beam directing assembly for delivering the write beam to the substrate, a positioning system for positioning the stage and beam directing assembly relative one another, and the foregoing apparatus for monitoring the position of the stage relative to the beam directing assembly.

In another aspect, the invention features a lithography method for use in fabricating integrated circuits on a wafer, the method including supporting the wafer on a moveable stage, imaging spatially patterned radiation onto the wafer, adjusting the position of the stage, and monitoring the position of the stage using the foregoing method.

In a further aspect, the invention features a lithography method for use in the fabrication of integrated circuits including directing input radiation through a mask to produce spatially patterned radiation, positioning the mask relative to the input radiation, monitoring the position of the mask relative to the input radiation using the foregoing method, and imaging the spatially patterned radiation onto a wafer.

In yet a further aspect, the invention features a lithography method for fabricating integrated circuits on a wafer including positioning a first component of a lithography system relative to a second component of a lithography system to expose the wafer to spatially patterned radiation, and monitoring the position of the first component relative to the second component using the foregoing method.

In another aspect, the invention features a method for fabricating integrated circuits that includes any of the foregoing lithography methods and/or using any of the foregoing lithography systems.

In yet another aspect, the invention features a method for fabricating a lithography mask, the method including directing a write beam to a substrate to pattern the substrate, positioning the substrate relative to the write beam, and monitoring the position of the substrate relative to the write beam using the foregoing method.

Embodiments of the invention may include one or more of the following advantages.

The methods, apparatus, and systems described herein may be used to provide highly accurate displacement and/or angle measurements of a measurement object by providing compensation for variations in refractivity that may occur in the path of an interferometer beam. Such measurements are useful for monitoring the location of a wafer stage in a lithography tool. The methods may provide contemporaneous compensation for certain errors in a displacement or angle measurement, allowing the methods to be employed during exposure of a wafer, for example. The methods may be used in conjunction with interferometers utilizing commonly-used optical components that may be economically manufactured. The methods are compatible with methods for compensating for other errors in a system.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference symbols in the various drawings indicate like elements.

DETAILED DESCRIPTION

Figure 1A:
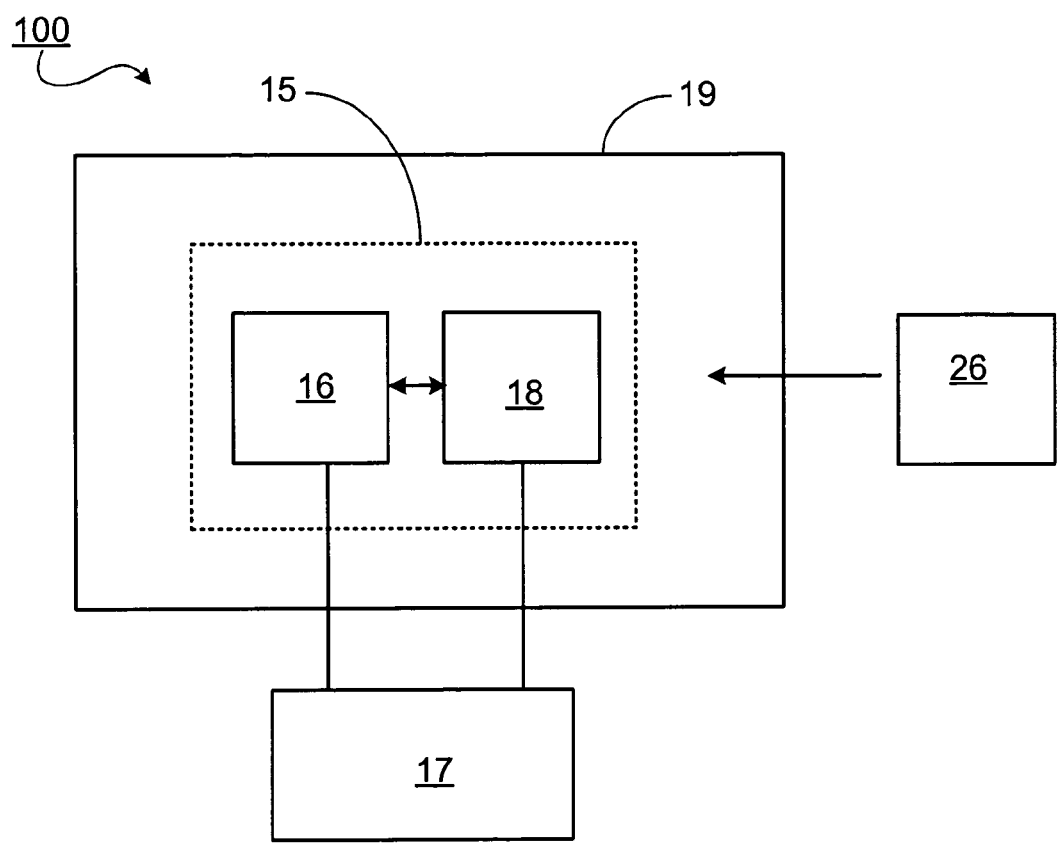
FIG. 1A is a schematic diagram showing a system including an interferometric system for monitoring a stage.

Referring to FIG. 1A, a system 100 employing an interferometric system 15 utilizes interferometers 18 monitor the position of a stage 16 within a housing 19. A gas source 26 is coupled to the housing and introduces gas into the housing according to the requirements of the process for which system 100 is used (e.g., a lithography exposure cycle). In some embodiments, system 100 includes a blower which forces gas flow through housing 19 in addition, or alternatively to gas source 26. The gas introduced by gas source 26 flows in a predetermined fashion through housing 19. A computer 17 is coupled to interferometers 18 and stage 16. Computer 17 adjusts the position of stage 16 in response to signals from interferometers 18.

Figure 1B:
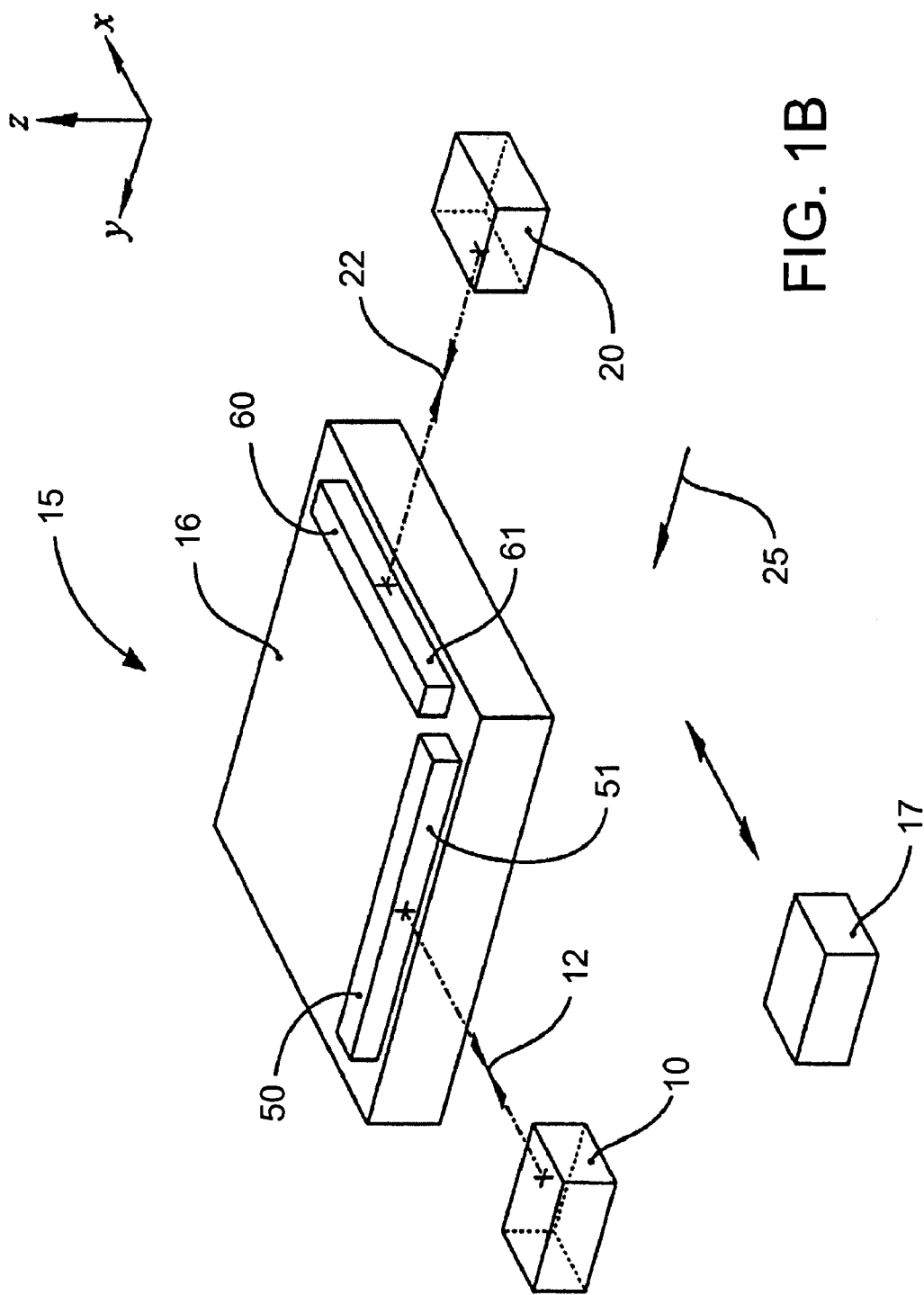
FIG. 1B is a perspective schematic diagram showing the interferometric system and stage.

Referring also to FIG. 1B, which is a diagrammatic perspective view of an embodiment of interferometric system 15 that employs a pair of orthogonally arranged interferometers 10 and 20 or interferometer subsystems by which information about the location and orientation of stage 16 is obtained. Interferometer system 15 is operated such that information about the location and orientation is subsequently used by a servo control system to control the location and orientation of stage 16. In normal operation, stage 16 is scanned in the y-direction for set values of x.

Affixed to stage 16 is a thin, high aspect ratio plane mirror measurement object 50 having a y-z reflective surface 51 elongated in the y-direction. Also fixedly mounted to stage 16 is another thin, high aspect ratio plane mirror measurement object 60 having a x-z reflective surface 61 elongated in the x-direction. Mirrors 50 and 60 are mounted on stage 16 so that their reflective surfaces, 51 and 61, respectively, are nominally orthogonal to one another. Stage 16 is otherwise mounted in a well-known manner for translations nominally in the x or y directions, but may experience small angular rotations about the x, y, and z axes due to bearing and drive mechanism tolerances.

Interferometer 10 measures the position in the x-direction and angular rotation of stage 16 about the y and/or z axes as stage 16 translates in the y-direction. Interferometer 10 is structured and arranged so that interferometric beams travel to and from mirror 50 generally along an optical path designated as 12.

Interferometer 20 is of the same type as that of interferometer 10, and is fixedly mounted off-stage to measure the position in the y-direction and angular rotation of stage 16 about the x and/or z axes as stage 16 translates in the y-direction. To achieve this, interferometer 20 directs and receives interferometric beams to and from mirror surface 61 along an optical path designated generally as 22. Control, data processing, and housekeeping functions are provided by a general purpose computer, such as that designated at 17, programmed to perform data processing and exchange signals and data between it and system 15 via an interface shown diagrammatically by the two way bold arrow.

In some embodiments, information obtained from one of the interferometers that has measurement axes parallel to either the x or y directions may also be used to determine a position on a measurement axis displaced from the measurement axes of the interferometer system. The displaced measurement axis may correspond, for example, to an alignment scope.

Figure 2:
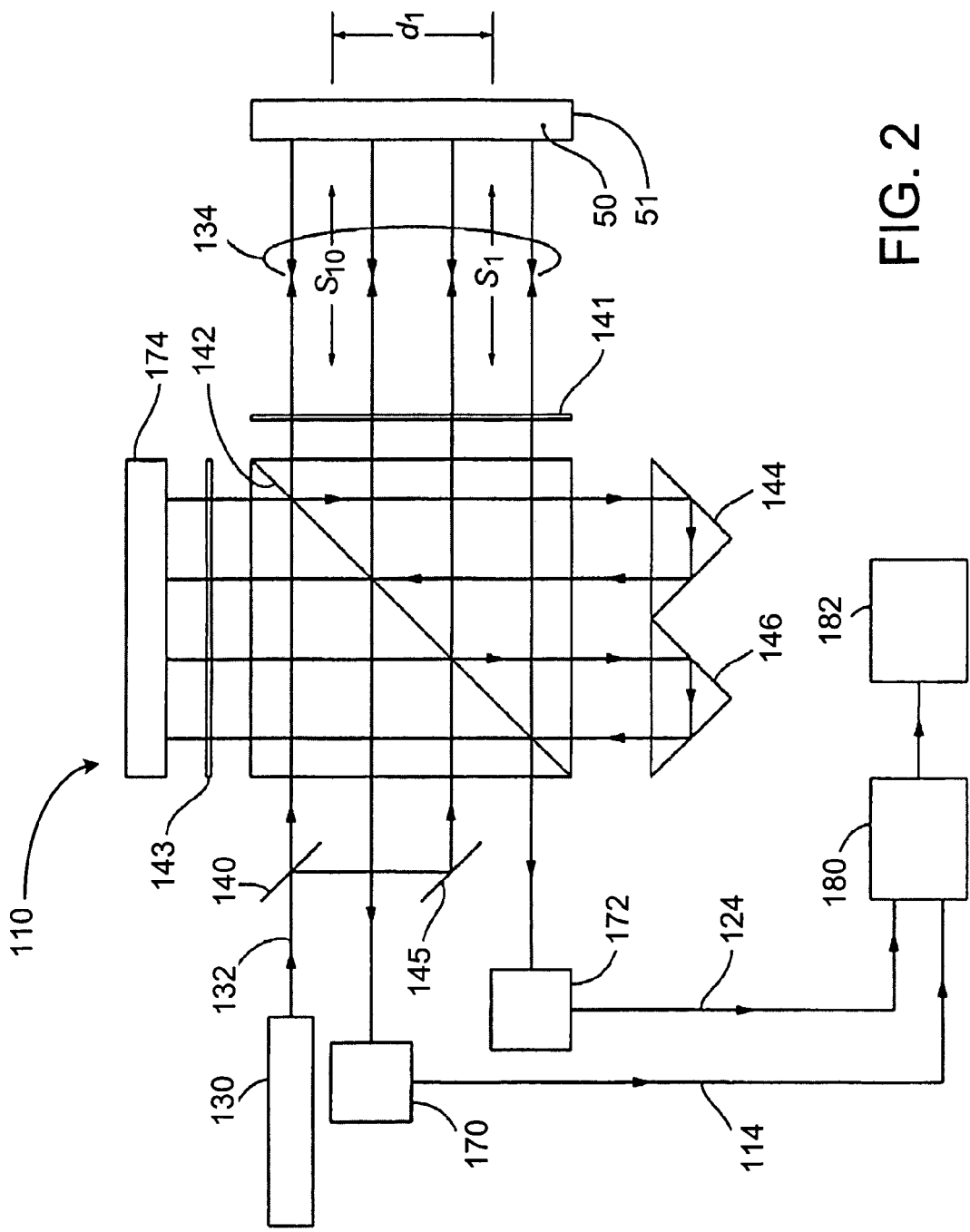
FIG. 2 is a schematic diagram of an embodiment of a multi-axis interferometer.

Interferometers 10 and 20 are multi-axis interferometers. Referring to FIG. 2, in some embodiments, interferometers 10 and 20 are plane mirror type interferometers, an example of which is shown as interferometer 110. Interferometer 110 includes two high stability plane mirror interferometers (HSPMIs) as shown schematically in FIG. 2 as an integral optical assembly. Interferometer 110 further also includes non-polarizing beam-splitter 140, polarizing beam-splitter interface 142, reference mirror 174, quarter-wave phase retardation plates 141 and 143, mirror 145, and retroreflectors 144 and 146. Detectors 170 and 172 monitor the intensity of beams exiting interferometer 110, while processors 180 and 182 process signals from the detectors to provide information about the position of mirror 50.

A source 130 provides a beam 132, which non-polarizing beam splitter 140 and mirror 145 split and direct into two parallel input beams. In embodiments which utilize a heterodyne detection scheme, the input beams include two orthogonally polarized components that have different frequencies. Source 130 can be any of a variety of frequency modulation apparatus and/or lasers. The two frequency components of beam 132 can be generated in source 130, for example, by laser Zeeman splitting, by acousto-optical modulation, or internal to the laser using birefringent elements, or the like.

Although interferometer 110 is described for operation as interferometer 10, interferometer 20 operates in an analogous manner. Beam 134 includes the measurement beams of the two HSPMIs that contact reflecting surface 51. The path of beam 134 corresponds to the path indicated by numeral 12 in FIG. 1B. Displacements $s_1$ and $s_2$ in FIG. 2 correspond to displacements $x_1$ and $x_2$, respectively, for interferometer 10. The two HSPMIs in interferometer 10 measure changes in displacements $x_1$ and $x_2$ of reflecting surface 51 along corresponding parallel measurement axes. These measurement axes are separated by a distance $d_1$. These measurements are used to determine the position of reflecting surface 51 (and hence stage 16) in the x-direction. For example, the position of the stage in the x-direction can be obtained from the average of $x_1$ and $x_2$. Similarly, interferometer 20 yields two displacement measurements, $y_1$ and $y_2$, respectively, which correspond to the displacement of reflecting surface 61 (and stage 16) along corresponding parallel measurement axes. Measured values of displacements $y_1$ and $y_2$ are used to determine the displacement of reflecting surface 61 along a measurement axis parallel to the y-axis and to determine the average change in orientation of reflecting surface 61 associated with two positions on reflecting surface 51 separated by a distance $d_2$.

Although a particular interferometer configuration is shown, other forms of interferometer configurations may also be used. Examples of other interferometer configurations are described in commonly owned published U.S. patent application No. 2003-0186136-A1, having Ser. No. 10/364,300, entitled "SEPARATED BEAM MULTIPLE DEGREE OF FREEDOM INTERFEROMETER," by Henry A. Hill, and also described in an article entitled "Differential interferometer arrangements for distance and angle measurements: Principles, advantages and applications" by C. Zanoni, *VDI Berichte* Nr. 749, 93-106 (1989) may be incorporated in the first embodiment without departing from the scope and spirit of the present invention. The contents of the cited U.S. patent application Ser. No. 10/364, 300 and the article by Zanoni are incorporated herein in their entirety by reference.

The interferometers of interferometer 10 introduce phase shifts $\tilde{\phi}_1$ and $\tilde{\phi}_{10}$ between the measurement and reference beams of interferometers corresponding to measurement paths $x_1$ and $x_2$, respectively. The magnitude of phase shifts $\tilde{\phi}_1$ and $\tilde{\phi}_{10}$ are related to physical lengths of measurement paths $x_1$ and $x_{10}$, respectively, according to the formulae $$\tilde{\phi}_i = 4k(x_i + Z_i + \zeta_i), i=1 \text{ and } 10, \quad (10)$$

where $x_i$ is the physical length of the measurement path for interferometer i, i=1 and 10 for interferometer 10, wavenumber $k=2\pi/\lambda$, $\lambda$ is the wavelength of the measurement beam, $Z_i$ is a contribution to the phase due to non-perturbative changes in the refractivity of the gas in the measurement path, and $\zeta_i$ is the contribution to the phase due to refractivity perturbations in the respective measurement path.

Similarly, the interferometers of interferometer 20 introduce phase shifts $\tilde{\phi}_2$ and $\tilde{\phi}_{20}$ between the measurement and reference beams of interferometers corresponding to measurement paths $y_2$ and $y_{20}$, respectively. The magnitude of phase shifts $\tilde{\phi}_2$ and $\tilde{\phi}_{20}$ are related to physical lengths of measurement paths $y_2$ and $y_{20}$, respectively, according to the formulae $$\tilde{\phi}_i = 4k(y_i + Z_i + \zeta_i), i=2 \text{ and } 20, \quad (11)$$

where $y_i$ is the physical length of the measurement path for interferometer i, i=2 and 20 for interferometer 20, $Z_i$ is a contribution to the phase due to non-perturbative changes in the refractivity of the gas in the measurement path, and $\zeta_i$ is the contribution to the phase due to refractivity perturbations in the respective measurement path.

In response to detecting beams exiting interferometer 110, detectors 170 and 172 generate electrical interference signals 114 and 124. Phase shifts $\tilde{\phi}_1$, $\tilde{\phi}_{10}$, $\tilde{\phi}_2$, and $\tilde{\phi}_{20}$ are derived from corresponding signals of signals 114 and 124, respectively, by processor 180 by known techniques used in processing heterodyne signals for phase information. The processing is by either digital or analog signal processes, preferably digital processes, using time-based phase detection such as a digital Hilbert transform phase detector (see, e.g., Section 4.1.1 of "Phase-locked loops: theory, design, and applications" 2nd Ed. McGraw-Hill (N.Y.) 1993, by R. E. Best) or sliding window finite Fourier transform (FFT) techniques.

The apparent angle $\theta_1$ of mirror 50 is determined by processor 182 according to the formula $$\vartheta_1 = \tan^{-1}\left[\frac{1}{d_1} \frac{(\tilde{\varphi}_{10} - \tilde{\varphi}_1)}{4k}\right]. \quad (12)$$

The apparent angle $\theta_2$ of mirror 60 is determined by processor 182 according to the formula $$\vartheta_2 = \tan^{-1}\left[\frac{1}{d_2} \frac{(\tilde{\varphi}_{20} - \tilde{\varphi}_2)}{4k}\right]. \quad (13)$$

The effects of refractivity variations (both perturbative and non-perturbative) on the measured value of $\theta_1$ and $\theta_2$ are evident on combining Equation (10) and Equation (12) and Equations (11) and (13) with the results $$\vartheta_1 = \frac{(x_{10} - x_1)}{d_1} + \frac{(Z_{10} - Z_1)}{d_1} + \frac{(\zeta_{10} - \zeta_1)}{d_1} \quad (14)$$

and $$\vartheta_2 = \frac{(y_{20} - y_2)}{d_2} + \frac{(Z_{20} - Z_2)}{d_2} + \frac{(\zeta_{20} - \zeta_2)}{d_2} \quad (15)$$

where only first order terms in expansion of $\tan^{-1}\rho$ have been retained.

The perturbative contributions $\zeta_{20}$ and $\zeta_2$ are substantially reduced or eliminated in the first embodiment by the design of the gas delivery system and the housing of interferometer 20 such that the direction of the gas flow is nominally in the positive y-direction indicated generally by arrow 25 in FIG. 1B and the gas flow in the measurement path 22 is laminar. In other words, system 100 is designed so that $\zeta_2 \approx \zeta_{20} \approx 0$.

The turbulent effect $\zeta_i$ is equal to the integral of turbulent component of the refractivity of the gas over the measurement path, i.e., $$\zeta_1 = \int_{P_1} [n(x_1, y_1, t) - 1]_T dx_1, \quad (16)$$

$$\zeta_{10} = \int_{P_{10}} [n(x_{10}, y_{10}, t) - 1]_T dx_{10} \quad (17)$$

where $P_1$ and $P_{10}$ denote the measurement paths for the first and second interferometers, respectively, of interferometer 10, t is time, $[n(x_i,y_i,t)-1]$ is the refractivity of the gas at location $(x_i,y_i,t)$, and $[n(x_i,y_i,t)-1]_T$ is the perturbative component of the $[n(x_i,y_i,t)-1]$.

The refractivities $[n(x_{10},y_{10},t)-1]_T$ and $[n(x_1,y_1,t)-1]_T$ are related to a good approximation because of the nominal flow of the gas in the x-y plane and in the positive y-direction as $$[n(x_{10},y_{10},t)-1]_T = \{n[x_1,y_1,t-\tau(x_1,y_1,t)]-1\}_T \quad (18)$$

where the points $(x_{10},y_{10})$ and $(x_1,y_1)$ lie on a line parallel to the gas flow velocity in the x-y plane, $$\tau(x_1, y_1, t) = \frac{d_1}{u(x_1, y_1, t)}, \quad (19)$$

and $u(x_1,y_1,t)$ is the component of the gas flow velocity in the y-direction.

Information about $\zeta_{10}(t)$ may be obtained from a $\tilde{\phi}_{10}(t)$ and $\tilde{\phi}_1(t)$ by use of the filter $$\frac{1}{4k}\sum_{p=1}^{N}\left(\frac{N-p+1}{N}\right)\begin{bmatrix}\tilde{\varphi}_{10}(t_{-p}) \\ -\tilde{\varphi}_1(t_{-p})\end{bmatrix} = +\sum_{p=1}^{N}\left(\frac{N-p+1}{N}\right)\begin{bmatrix}x_{10}(t_{-p}) \\ -x_1(t_{-p})\end{bmatrix} + \sum_{p=1}^{N}\left(\frac{N-p+1}{N}\right)\begin{bmatrix}Z_{10}(t_{-p}) \\ -Z_1(t_{-p})\end{bmatrix} + \sum_{p=1}^{N}\left(\frac{N-p+1}{N}\right)\begin{bmatrix}\zeta_{10}(t_{-p}) \\ -\zeta_1(t_{-p})\end{bmatrix} \quad (20)$$

where N is an integer, e.g., 16, $$t_{-p} = t - \sum_{s=1}^{p}\tau_s, \quad (121)$$

and $\tau_p$ is defined such that $$\zeta_1(t_{-p}) = \zeta_{10}(t_{-p} + \tau_p) \quad (22)$$
$$= \zeta_{10}(t_{-p+1}).$$

The dependence of $\zeta_1(t)$ and $\zeta_{10}(t)$ on $y_1$, $y_{10}$, and t in Equation (22) has been suppressed and it is assumed in Equations (20) and (22) that $\tau(x_1,y_1,t)$ defined by Equation (19) is independent of $x_1$. The effect of departures from a dependence on $x_1$ and $x_{10}$ is examined in a subsequent discussion.

The measured perturbative contribution in Equation (20) denoted as $[\zeta_{10}(t)]_M$, i.e., $$[\zeta_{10}(t)]_M = \sum_{p=1}^{N}\left(\frac{N-p+1}{N}\right)[\zeta_{10}(t_{-p}) - \zeta_1(t_{-p})] \quad (23)$$

is reduced to a simpler form using the property given by Equation (22). Accordingly, $$[\zeta_{10}(t)]_M = \sum_{p=1}^{N}\left(\frac{N-p+1}{N}\right)[\zeta_{10}(t_{-p}) - \zeta_{10}(t_{-p} + \tau_p)], \quad (24)$$

$$[\zeta_{10}(t)]_M = -\zeta_{10}(t) + \sum_{p=1}^{N}\left(\frac{N-p+1}{N}\right)\zeta_{10}(t_{-p}) - \sum_{p=2}^{N}\left(\frac{N-p+1}{N}\right)\zeta_{10}(t_{-p+1}), \quad (25)$$

$$[\zeta_{10}(t)]_M = -\zeta_{10}(t) - \sum_{p=1}^{N-1}\left(\frac{N-p}{N}\right)\zeta_{10}(t_{-p}) + \sum_{p=1}^{N-1}\left(\frac{N-p+1}{N}\right)\zeta_{10}(t_{-p}) + \frac{1}{N}\zeta_{10}(t_{-N}), \quad (26)$$

$$[\zeta_{10}(t)]_M = -\zeta_{10}(t) - \sum_{p=1}^{N-1}\left[\left(\frac{N-p}{N}\right) - \left(\frac{N-p+1}{N}\right)\right]\zeta_{10}(t_{-p}) + \frac{1}{N}\zeta_{10}(t_{-N}), \quad (27)$$

$$[\zeta_{10}(t)]_M = -\zeta_{10}(t) + \frac{1}{N}\sum_{p=1}^{N}\zeta_{10}(t_{-p}). \quad (28)$$

Note that $[\zeta_{10}(t)]_M$ can be computed as a feed-forward signal, i.e., the summation starts with $\zeta_{10}(t_{-1})$ and $\zeta_1(t_{-1})$ in Equation (23), for a contemporaneous mode of operation.

Because the perturbative effects contributing to the phase are substantially random, the second term, $$\frac{1}{N}\sum_{p=1}^{N}\zeta_{10}(t_{-p}), \quad (29)$$

on the right hand side of Equation (28) has a mean value of zero. Note that the contributions to the phase by refractivity variations that do not average to zero are classified as non-perturbative effects and are included in $Z_{10}(t)$.

The standard deviation of the term in Equation (29) is $$\frac{1}{\sqrt{N}}\sigma_{\zeta_{10}} \quad (30)$$

where $\sigma_{\zeta_{10}}$ is the standard deviation of $\zeta_{10}(t)$. Thus, the standard deviation of Equation (29) about zero reduces as $N^{-1/2}$ as N increases.

Therefore, the contribution to phase measurement $\tilde{\phi}_{10}(t)$ due to refractivity permutations can be obtained from $$[\zeta_{10}(t)]_M = \frac{1}{4k}\sum_{p=1}^{N}\left(\frac{N-p+1}{N}\right)[\tilde{\varphi}_{10}(t_{-p}) - \tilde{\varphi}_1(t_{-p})] - \sum_{p=1}^{N}\left(\frac{N-p+1}{N}\right)[Z_{10}(t_{-p}) - Z_1(t_{-p})] - \sum_{p=1}^{N}\left(\frac{N-p+1}{N}\right)[x_{10}(t_{-p}) - x_1(t_{-p})] \quad (31)$$

Because non-perturbative variations in refractivity typically occur over timescales$\gg\tau$, the $[Z_{10}(t_{-p})-Z_i(t_{-p})]$ terms are effectively zero. Alternatively, or additionally, the $[Z_{10}(t_{-p})-Z_1(t_{-p})]$ terms can be determined using methods disclosed for determining non-perturbative variations in refractivity in, e.g., aforementioned U.S. patent application Ser. No. 10/294,158, entitled "COMPENSATING FOR EFFECTS OF VARIATIONS IN GAS REFRACTIVITY IN INTERFEROMETERS," filed Nov. 11, 2002. This patent application discloses methods for determining non-perturbative variations in refractivity by deriving a non-trivial function relating the gas properties at different locations in a system at different times in an cyclical process. In general, the non-trivial function can be in any format suitable for mapping one value to another value based on one or more parameters. For example, the non-trivial function can be an analytic function, a set of analytic functions, an algorithm or a lookup table. One example is a set of analytic functions, each function corresponding to a different system parameter (e.g., the stage of the exposure cycle).

The non-trivial function can be determined empirically, computationally, or using a combination of empirical and computational techniques.

One example of a method for determining the function empirically is to execute one or more cycles with refractivity sensors in the system, and to monitor one or more parameters at the sensor locations during the cycle. A simple example of this is to place one or more refractometers in a measurement beam path and to monitor the refractivity there as well as at a remote position during a test exposure. The refractometer monitors remains in the system during subsequent operation of the system, during which time the processor uses the non-trivial function to determine the gas refractivity in the measurement beam path from the value measured at the remote location according to the values measured during the test exposure.

Another way to determine the non-trivial function is using computational methods such as computational fluid dynamics programs. One example of such a program is Star CD, commercially available from the CD adapco Group (Melville, N.Y.). In general, computational fluid dynamics solve fluid dynamics problems in complex systems by solving one or more sets of differential equations relating parameters of the fluid (e.g., density, temperature) at a set of discrete locations and times within the system. For example, for an incompressible fluid, one might use the Navier-Stokes equation, which is the fundamental partial differential equation that describes the flow of such fluids. The set of discrete locations, often referred to as a mesh, is usually defined according to the physical structure of the system. The differential equation(s) usually requires a set of user-defined boundary values describing, e.g., initial system conditions to be entered prior to solving. These can include boundary conditions for any parameter, such as an initial temperature profile, or the temperature of certain portions of the mesh at particular times during a cycle.

Accordingly, by determining an appropriate mesh and entering conditions for the exposure cycle, one can computationally determine values of the gas refractivity and/or other parameters at different locations in the system during the cycle. These values provide the non-trivial function, which relates gas refractivity measured at a remote location to the refractivity in the path of the interferometer measurement beam.

In determining $[\zeta_{10}(t)]_M$ using Equation (31), the $[x_{10}(t_{-p}) - x_1(t_{-p})]$ terms can be determined from $\tilde{\phi}_{20}(t)$ and $\tilde{\phi}_2(t)$, which provide a redundant measurement of variations in the angular orientation of stage 16 and are substantially free of the effects of refractivity perturbations.

In order to determine the accuracy to which corrections in orientation of mirror 50 should be made to achieve a given accuracy in the filtered quantity $[\zeta_{10}(t)]_M$ in Equation (28), the effect of errors in the corrections for changes in the orientation of mirror 50 in Equation (20) are next evaluated. The effect of errors in the corrections for changes in the orientation of mirror 50 are introduced by a term of the form $$\sum_{p=1}^{N} \left(\frac{N-p+1}{N}\right)[y_{20}(t_{-p}) - y_2(t_{-p})] \tag{32}$$

that is the same form as a corresponding term on the right hand side of Equation (20) in $x_{10}$ and $x_1$. The effects of the filtered quantity given by Equation (32) can be evaluated by a frequency domain analysis using a frequency dependent transfer function and by a statistical analysis assuming that the statistical error in the measurement values of $y_{20}(t_{-p})$ and $y_2(t_{-p})$ are uncorrelated.

For the frequency domain analysis, a transfer function can be derived for a frequency component $\cos(\omega t + \phi_0)$ of $[y_{20}(t) - y_2(t)]$ with an amplitude $\alpha$, a phase $\phi_0$, an angular frequency $\omega$, and assuming a uniform value for $\tau_s$, i.e., $\tau_s = \tau$. The filtered frequency component of the orientation term is $$\sum_{p=1}^{N} \left(\frac{N-p+1}{N}\right)[y_{20}(t_{-p}) - y_2(t_{-p})] = \tag{33}$$

$$+ a \sum_{p=1}^{N} \left(\frac{N-p+1}{N}\right) \cos[(\omega t + \phi_0) - p\omega\tau].$$

The frequency dependent component of the right hand side of Equation (33) can be expressed in a closed form as $$\sum_{p=1}^{N} \left(\frac{N-p+1}{N}\right) \cos[(\omega t + \phi_0) - p\omega\tau] = \frac{1}{2N \sin\left(\frac{\omega\tau}{2}\right)} \times \tag{34}$$

$$\left\{ N \sin\left[(\omega t + \phi_0) - \left(\frac{\omega\tau}{2}\right)\right] - \sin\left[(\omega t + \phi_0) - (2N+1)\left(\frac{\omega\tau}{2}\right)\right] - \frac{\sin\left[(N-1)\left(\frac{\omega\tau}{2}\right)\right]}{\sin\left(\frac{\omega\tau}{2}\right)} \sin\left[(\omega t + \phi_0) - (N+1)\left(\frac{\omega\tau}{2}\right)\right] \right\}.$$

The transfer function represented by Equation (34) can be used to evaluate the effect of errors in the corrections for changes in the orientation of mirror 50.

Assuming the statistical error in the measured values of $y_{20}(t_{-p})$ and $y_2(t_{-p})$ are uncorrelated, the standard deviation of the term expressed by Equation (32), $\sigma_{\theta y}$, is $$\sigma_{\theta y} = N^{1/2} \left(\frac{2}{3}\right)^{1/2} \left(1 + \frac{1}{N}\right)^{1/2} \left(1 + \frac{1}{2N}\right)^{1/2} \sigma_y \tag{35}$$

where $\sigma_y$ is the standard deviation for a measurement of either $y_{20}(t_{-p})$ and $y_2(t_{-p})$ Note that the statistical error $\sigma_{\theta_y}$ is proportional to $N^{1/2}$. However, this increase in statistical error associated with larger values of N can be offset by taking advantage of the fact that the bandwidth of the refractivity perturbations is $\dot{c}$ 100 Hz and/or by a reduction in the size of the statistical error $\sigma_y$. To take advantage of the relatively small bandwidth of the gas turbulence effects, the measured values of $y_{20}(t_{-p})$ and $y_2(t_{-p})$ can be filtered by a low pass filter with a pass bandwidth that is less than the bandwidth of the air turbulence effects. For example, the bandwidth of the statistical error in the measured values of $y_{20}(t_{-p})$ and $y_2(t_{-p})$ can be of the order of a 100 MHz in which case the statistical error in $\sigma_{\theta_y}$ due to $\sigma_y$ can be reduced by several orders of magnitude (e.g., 2-3 orders of magnitude).

Information about $\zeta_1(t)$ may be obtained from $[\zeta_{10}(t)]_M$. Alternatively, or additionally, information about $\zeta_1(t)$ can be obtained from $\tilde{\phi}_{10}(t)$ and $\tilde{\phi}_1(t)$ by use of the filter $$\frac{1}{4k}\sum_{p=1}^{N}\left(\frac{N-p+1}{N}\right)\begin{bmatrix}\tilde{\varphi}_{10}(t_{-p+1})\\ -\tilde{\varphi}_1(t_{-p+1})\end{bmatrix}= \tag{36}$$

$$\sum_{p=1}^{N}\left(\frac{N-p+1}{N}\right)\begin{bmatrix}x_{10}(t_{-p+1})\\ -x_1(t_{-p+1})\end{bmatrix}+$$

$$\sum_{p=1}^{N}\left(\frac{N-p+1}{N}\right)\begin{bmatrix}Z_{10}(t_{-p+1})\\ -Z_1(t_{-p+1})\end{bmatrix}+\sum_{p=1}^{N}\left(\frac{N-p+1}{N}\right)\begin{bmatrix}\zeta_{10}(t_{-p+1})\\ -\zeta_1(t_{-p+1})\end{bmatrix}$$

where $t_0=t$ (see Equation (121)). The measured contribution to the phase by refractivity perturbations in Equation (36) is denoted as $[\zeta_1(t)]_M$, i.e., $$[\zeta_1(t)]_M = \sum_{p=1}^{N}\left(\frac{N-p+1}{N}\right)[\zeta_{10}(t_{-p+1})-\zeta_1(t_{-p+1})], \tag{37}$$

and is reduced to a simpler form using the property given by Equation (22). Accordingly, $$[\zeta_1(t)]_M = \sum_{p=1}^{N}\left(\frac{N-p+1}{N}\right)[\zeta_1(t_{-p})-\zeta_1(t_{-p+1})], \tag{38}$$

$$[\zeta_1(t)]_M = \sum_{p=1}^{N}\left(\frac{N-p+1}{N}\right)\zeta_1(t_{-p}) - \\ \sum_{p=2}^{N}\frac{N-p+1}{N}\zeta_1(t_{-p}+1) - \zeta_1(t), \tag{39}$$

$$[\zeta_1(t)]_M = \sum_{p=1}^{N}\left(\frac{N-p+1}{N}\right)\zeta_1(t_{-p}) - \\ \sum_{p=2}^{N-1}\left(\frac{N-p}{N}\right)\zeta_1(t_{-p}) - \zeta_1(t), \tag{40}$$

$$[\zeta_1(t)]_M = \sum_{p=1}^{N-1}\left(\frac{1}{N}\right)\zeta_1(t_{-p}) + \frac{1}{N}\zeta_1(t_{-N}) - \zeta_1(t), \tag{41}$$

$$[\zeta_1(t)]_M = -\zeta_1(t) + \frac{1}{N}\sum_{p=1}^{N}\zeta_1(t_{-p}). \tag{42}$$

Note that $[\zeta^1(t)]_M$ can be computed for use in a contemporaneous mode of operation. The computation of $[\zeta_1(t)]_M$ is in a non-feed forward mode, i.e., the summation starts with $\zeta_{10}(t_0)$ and $\zeta_1(t_0)$ in Equation (37), unlike the computation of $[\zeta_{10}(t)]_M$ given by Equation (28).

The effectiveness of the compensation techniques for perturbations in gas refractivity can be tested contemporaneously. The contemporaneous test includes determining the effects of refractivity perturbations on angular displacements of a measurement object by two different techniques. The first technique is based on the compensation technique discussed previously. The second technique is based on a direct measurement of the corresponding effects of refractivity perturbations.

For the first technique, the effects refractivity perturbations on the measurement of the orientation of plane mirror measurement object 50 is obtained using the filter $$\frac{1}{4k}\sum_{p=1}^{N}\left(\frac{N-p+1}{N}\right)\begin{bmatrix}\tilde{\varphi}_{10}(t_{-p})\\ -\tilde{\varphi}_1(t_{-p})\end{bmatrix}- \tag{43}$$

$$\frac{1}{4k}\sum_{p=1}^{N}\left(\frac{N-p+1}{N}\right)\begin{bmatrix}\tilde{\varphi}_{10}(t_{-p+1})\\ -\tilde{\varphi}_1(t_{p+1})\end{bmatrix}=$$

$$+\frac{1}{4k}\sum_{p=1}^{N}\left(\frac{N-p+1}{N}\right)\left[\tilde{\varphi}_{10}\left(t-\sum_{s=1}^{P}\tau_s\right)-\tilde{\varphi}_1\left(t-\sum_{s=1}^{P}\tau_s\right)\right]-$$

$$\frac{1}{4k}\sum_{p=1}^{N}\left(\frac{N-p+1}{N}\right)\left[\tilde{\varphi}_{10}\left(t-\sum_{s=0}^{p-1}\tau_s\right)-\tilde{\varphi}_1\left(t-\sum_{s=0}^{p-1}\tau_s\right)\right].$$

The following steps are performed to arrive at a simpler expression.

$$\frac{1}{4k}\sum_{p=1}^{N}\left(\frac{N-p+1}{N}\right)\begin{bmatrix}\tilde{\varphi}_{10}(t_{-p})\\ -\tilde{\varphi}_1(t_{-p})\end{bmatrix}- \tag{44}$$

$$\frac{1}{4k}\sum_{p=1}^{N}\left(\frac{N-p+1}{N}\right)\begin{bmatrix}\tilde{\varphi}_{10}(t_{-p+1})\\ -\tilde{\varphi}_1(t_{p+1})\end{bmatrix}=$$

$$+\frac{1}{4k}\sum_{p=1}^{N}\left(\frac{N-p+1}{N}\right)\begin{bmatrix}\tilde{\varphi}_{10}(t_{-p})\\ -\tilde{\varphi}_1(t_{-p})\end{bmatrix}-$$

$$\frac{1}{4k}\sum_{p=1}^{N-1}\left(\frac{N-p}{N}\right)\begin{bmatrix}\tilde{\varphi}_{10}(t_{-p})\\ -\tilde{\varphi}_1(t_{-p})\end{bmatrix}-\frac{1}{4k}[\tilde{\varphi}_{10}(t)-\tilde{\varphi}_1(t)],$$

-continued $$\frac{1}{4k}\sum_{p=1}^{N}\left(\frac{N-p+1}{N}\right)\begin{bmatrix}\tilde{\varphi}_{10}(t_{-p})\\-\tilde{\varphi}_{1}(t_{-p})\end{bmatrix}- \quad (45)$$

$$\frac{1}{4k}\sum_{p=1}^{N}\left(\frac{N-p+1}{N}\right)\begin{bmatrix}\tilde{\varphi}_{10}(t_{-p+1})\\-\tilde{\varphi}_{1}(t_{-p+1})\end{bmatrix}=$$

$$+\frac{1}{4k}\frac{1}{N}\sum_{p=1}^{N-1}\begin{bmatrix}\tilde{\varphi}_{10}(t_{-p})\\-\tilde{\varphi}_{1}(t_{-p})\end{bmatrix}+\frac{1}{4k}\frac{1}{N}\begin{bmatrix}\tilde{\varphi}_{10}(t_{-N})\\-\tilde{\varphi}_{1}(t_{-N})\end{bmatrix}-\frac{1}{4k}\begin{bmatrix}\tilde{\varphi}_{10}(t)\\-\tilde{\varphi}_{1}(t)\end{bmatrix},$$

$$\frac{1}{4k}\sum_{p=1}^{N}\left(\frac{N-p+1}{N}\right)\begin{bmatrix}\tilde{\varphi}_{10}(t_{-p})\\-\tilde{\varphi}_{1}(t_{-p})\end{bmatrix}- \quad (46)$$

$$\frac{1}{4k}\sum_{p=1}^{N}\left(\frac{N-p+1}{N}\right)\begin{bmatrix}\tilde{\varphi}_{10}(t_{-p+1})\\-\tilde{\varphi}_{1}(t_{-p+1})\end{bmatrix}=$$

$$+\frac{1}{4k}\frac{1}{N}\sum_{p=1}^{N-1}[\tilde{\varphi}_{10}(t_{-p})-\tilde{\varphi}_{1}(t_{-p})]-\frac{1}{4k}[\tilde{\varphi}_{10}(t)-\tilde{\varphi}_{1}(t)].$$

The right hand side of Equation (46) can be written in terms of linear displacements, and non-perturbative and perturbative refractivity variations, as $$\frac{1}{4k}\frac{1}{N}\sum_{p=1}^{N}\begin{bmatrix}\tilde{\varphi}_{10}(t_{-p})\\-\tilde{\varphi}_{1}(t_{-p})\end{bmatrix}-\begin{bmatrix}\tilde{\varphi}_{10}(t)\\-\tilde{\varphi}_{1}(t)\end{bmatrix}= \quad (47)$$

$$-[x_{10}(t)-x_{1}(t)]+\frac{1}{N}\sum_{p=1}^{N}\begin{bmatrix}x_{10}(t_{-p})\\-x_{1}(t_{-p})\end{bmatrix}-\begin{bmatrix}Z_{10}(t)\\-Z_{1}(t)\end{bmatrix}+$$

$$\frac{1}{N}\sum_{p=1}^{N}\begin{bmatrix}Z_{10}(t_{-p})\\-Z_{1}(t_{-p})\end{bmatrix}-\begin{bmatrix}\zeta_{10}(t)\\-\zeta_{1}(t)\end{bmatrix}+\frac{1}{N}\sum_{p=1}^{N}\begin{bmatrix}\zeta_{10}(t_{-p})\\-\zeta_{1}(t_{-p})\end{bmatrix}.$$

The difference of the terms characterizing perturbative variations of the refractivity in Equation (47) can be obtained using Equations (28) and (42) as $$[\zeta_{10}(t)]_M - [\zeta_1(t)]_M = -\begin{bmatrix}\zeta_{10}(t)\\-\zeta_{1}(t)\end{bmatrix}+\frac{1}{N}\sum_{p=1}^{N}\begin{bmatrix}\zeta_{10}(t_{-p})\\-\zeta_{1}(t_{-p})\end{bmatrix}. \quad (48)$$

The refractivity perturbation dependent terms $[\zeta_{10}(t)]_M - [\zeta_1(t)]_M$ may be reduced to a simpler form using the property given by Equation (22) as $$[\zeta_{10}(t)]_M - [\zeta_1(t)]_M = -[\zeta_{10}(t)-\zeta_1(t)]+\frac{1}{N}[\zeta_{10}(t_{-N})-\zeta_1(t_{-1})]. \quad (49)$$

Also, the $[\zeta_{10}(t)]_M - [\zeta_1(t)]_M$ may be computed for use in a contemporaneous mode of operation.

The second term, $$\frac{1}{N}[\zeta_{10}(t_{-N})-\zeta_1(t_{-1})], \quad (50)$$

on the right hand side of Equation (49) has a mean value of zero. The standard deviation of the term in Equation (50) is $$\left(\frac{2}{N}\right)^{1/2}\sigma_\zeta \quad (51)$$

where $\sigma_\zeta$ is the standard deviations of $\zeta_{10}(t)$ and $\zeta_1(t)$, which are assumed to be the same.

The accuracy to which corrections in orientation of mirror 50 should be made to achieve a given accuracy in the filtered quantity $[\zeta_{10}(t)]_M - [\zeta_1(t)]_M$ in Equation (47) can be determined similarly to the accuracy to which corrections in orientation of mirror 50 should be made to achieve a given accuracy in the filtered quantity $[\zeta_{10}(t)]_M$. In particular, the effect of errors in the corrections for changes in the orientation of mirror 50 in Equation (47) are introduced by a term of the form $$-[y_{20}(t)-y_2(t)]+\frac{1}{N}\sum_{p=1}^{N}[y_{20}(t_{-p})-y_2(t_{-p})]. \quad (52)$$

The effects of the filtered quantity given by Equation (52) can be evaluated by a frequency domain analysis using a frequency dependent transfer function and by a statistical analysis assuming that the statistical error in the measurement values of $y_{20}(t_{-p})$ and $y_2(t_{-p})$ are uncorrelated.

For the frequency domain analysis, a transfer function can be derived for a frequency component $\cos(\omega t+\phi_0)$ of $[y_{20}(t)-y_2(t)]$ at angular frequency $\omega$ with an amplitude $\alpha$ and a phase $\phi_0$ and assuming a fixed value for $\tau_s$, i.e., $\tau_s=\tau$. The filtered frequency component of the orientation term can be expressed in a closed form as $$-[y_{20}(t)-y_2(t)]+\frac{1}{N}\sum_{p=1}^{N}[y_{20}(t_{-p})-y_2(t_{-p})]= \quad (53)$$

$$-a\left\{\cos(\omega t+\phi_0)-\frac{\sin\left(\frac{N\omega\tau}{2}\right)}{N\sin\left(\frac{\omega\tau}{2}\right)}\cos\left[\omega t+\phi_0-(N+1)\left(\frac{\omega\tau}{2}\right)\right]\right\}.$$

The transfer function represented by Equation (53) can be used to evaluate the effect of errors in the corrections for changes in the orientation of mirror 50.

For the statistical analysis where it is assumed that the statistical error in the measured values of $y_{20}(t_{-p})$ and $y_2(t_{-p})$ are uncorrelated, the standard deviation of the term expressed by Equation (52), $\sigma_{\theta y}$, is $$\sigma_{\theta y}=\sqrt{2}\left(1+\frac{1}{N}\right)^{1/2}\sigma_y. \quad (54)$$

This increase in statistical error by $\sqrt{2}$ can be offset by taking advantage of the fact that the bandwidth of the gas turbulence effects is relatively low frequency (e.g., $\dot{c}$ 100 Hz) compared to the data acquisition rate and/or by a reduction in the size of the statistical error $\sigma_y$. To take advantage of the relatively small bandwidth of the gas turbulence effects, the measured values of $y_{20}(t_{-p})$ and $y_2(t_{-p})$ can be filtered by a low pass filter with a pass bandwidth that is >> than the bandwidth of the air turbulence effects. For example, the bandwidth of the statistical error in the measured values of $y_{20}(t_{-p})$ and $y_2(t_{-p})$ can be of the order of a 100 MHz in which case the statistical in $\sigma_{\theta y}$ due to $\sigma_y$ can be reduced by several orders of magnitude.

For the second technique, the effects of perturbations in refractivity on the measurement of the orientation of plane mirror measurement object 50 is obtained directly from the difference $$\frac{1}{4k}\left\{[\tilde{\varphi}_{10}(t) - \tilde{\varphi}_1(t)] - \left(\frac{d_1}{d_2}\right)[\tilde{\varphi}_{20}(t) - \tilde{\varphi}_2(t)]\right\} \quad (55)$$

The quantity given by Equation (55) corresponds to measurement of $[\zeta_{10}(t)]_M - [\zeta_1(t)]_M$ that is independent of the value obtained when using the filter given by Equation (47). The measured value obtained for $[\zeta_{10}(t)]_M - [\zeta_1(t)]_M$ according to Equation (55) is a direct measure of the effects of refractivity perturbations and therefore can be used to evaluate the accuracy of the assumptions used in deriving the foregoing compensation techniques. The measured value obtained for $[\zeta_{10}(t)]_M - [\zeta_1(t)]_M$ according to Equation (55) can be used to determine when inappropriate values for $\tau_p$ have been used.

In the foregoing discussion, $\tau_p$ (and hence u) is assumed a known parameter (e.g., determined empirically by measurement or using mathematical models and computer simulation). The foregoing discussion also assumes $\tau_p$ (and hence u) to be constant. However, in reality, $\tau_p$ can vary as a function of time and/or position along the measurement beam paths. Moreover, an incorrect value for $\tau_p$ can adversely affect the accuracy of the foregoing techniques for determining the contribution of refractivity perturbations to a measured phase.

The effects of an incorrect value, $\tau_p'$, for $\tau_p$ can be evaluated for $[\zeta_{10}(t)]_M$ where $$[\zeta_{10}(t)]_M^\dagger = \sum_{p=1}^{N}\left(\frac{N-p+1}{N}\right)[\zeta_{10}(t'_{-p}) - \zeta_1(t'_{-p})] \quad (56)$$

and $$t'_{-p} = t - \sum_{s=1}^{p}\tau'_s. \quad (57)$$

Note that $t_0' = t$. The following steps are performed to arrive at a simpler expression for $[\zeta_{10}(t)]_M^\dagger$.

$$[\zeta_{10}(t)]_M^\dagger = \sum_{p=1}^{N}\left(\frac{N-p+1}{N}\right)\begin{bmatrix}\zeta_{10}(t_{-p})\\-\zeta_1(t_{-p})\end{bmatrix} + \quad (58)$$

$$\sum_{p=1}^{N}\left(\frac{N-p+1}{N}\right)\begin{bmatrix}\zeta_{10}(t'_{-p})\\-\zeta_{10}(t_{-p})\end{bmatrix} - \sum_{p=1}^{N}\left(\frac{N-p+1}{N}\right)\begin{bmatrix}\zeta_1(t'_{-p})\\-\zeta_1(t_{-p})\end{bmatrix}.$$

Incorporating the result given by Equation (28), $$[\zeta_{10}(t)]_M^\dagger = -\zeta_{10}(t) + \frac{1}{N}\sum_{p=1}^{N}\zeta_{10}(t_{-p}) + \quad (59)$$

$$\sum_{p=1}^{N}\left(\frac{N-p+1}{N}\right)\begin{bmatrix}\zeta_{10}(t'_{-p})\\-\zeta_{10}(t_{-p})\end{bmatrix} - \sum_{p=1}^{N}\left(\frac{N-p+1}{N}\right)\begin{bmatrix}\zeta_1(t'_{-p})\\-\zeta_1(t_{-p})\end{bmatrix}.$$

Using Equation (22), $$[\zeta_{10}(t)]_M^\dagger = -\zeta_{10}(t) + \frac{1}{N}\sum_{p=1}^{N}\zeta_{10}(t_{-p}) + \quad (60)$$

$$\sum_{p=1}^{N}\left(\frac{N-p+1}{N}\right)\begin{bmatrix}\zeta_{10}(t'_{-p})\\-\zeta_{10}(t_{-p})\end{bmatrix} - \sum_{p=1}^{N}\left(\frac{N-p+1}{N}\right)\begin{bmatrix}\zeta_{10}(t'_{-p}+\tau_p)\\-\zeta_{10}(t_{-p+1})\end{bmatrix},$$

$$[\zeta_{10}(t)]_M^\dagger = -\zeta_{10}(t) + \frac{1}{N}\sum_{p=1}^{N}\zeta_{10}(t_{-p}) + \quad (61)$$

$$\sum_{p=1}^{N}\left(\frac{N-p+1}{N}\right)\begin{bmatrix}\zeta_{10}(t'_{-p})\\-\zeta_{10}(t_{-p})\end{bmatrix} - \sum_{p=1}^{N}\left(\frac{N-p+1}{N}\right)\begin{bmatrix}\zeta_{10}(t'_{-p+1}+\tau_p-\tau'_p)\\-\zeta_{10}(t_{-p+1})\end{bmatrix},$$

$$[\zeta_{10}(t)]_M^\dagger = -\zeta_{10}(t) + \frac{1}{N}\sum_{p=1}^{N}\zeta_{10}(t_{-p}) - \zeta_{10}[t+(\tau_1-\tau'_1)] + \zeta_{10}(t) + \quad (62)$$

$$\sum_{p=1}^{N}\left(\frac{N-p+1}{N}\right)\begin{bmatrix}\zeta_{10}(t'_{-p})\\-\zeta_{10}(t_{-p})\end{bmatrix} - \sum_{p=2}^{N}\left(\frac{N-p+1}{N}\right)\begin{bmatrix}\zeta_{10}(t'_{-p+1}+\tau_p-\tau'_p)\\-\zeta_{10}(t_{-p+1})\end{bmatrix},$$

-continued $$[\zeta_{10}(t)]_M^\dagger = -\zeta_{10}(t) + \frac{1}{N}\sum_{p=1}^{N} \zeta_{10}(t_{-p}) - \zeta_{10}[t+(\tau_1-\tau_1')] + \zeta_{10}(t) + \sum_{p=1}^{N}\left(\frac{N-p+1}{N}\right)\begin{bmatrix}\zeta_{10}(t'_{-p})\\-\zeta_{10}(t_{-p})\end{bmatrix} - \sum_{p=1}^{N}\left(\frac{N-p}{N}\right)\begin{bmatrix}\zeta_{10}(t'_{-p}+\tau_{p+1}-\tau'_{p+1})\\-\zeta_{10}(t_{-p})\end{bmatrix},$$ (63)

$$[\zeta_{10}(t)]_M^\dagger = -\zeta_{10}(t) + \frac{1}{N}\sum_{p=1}^{N} \zeta_{10}(t_{-p}) - \zeta_{10}[t+(\tau_1-\tau_1')] + \zeta_{10}(t) + \frac{1}{N}[\zeta_{10}(t'_{-N}) - \zeta_{10}(t_{-N})] + \sum_{p=1}^{N-1}\left(\frac{1}{N}\right)\begin{bmatrix}\zeta_{10}(t'_{-p})\\-\zeta_{10}(t_{-p})\end{bmatrix} - \sum_{p=1}^{N-1}\left(\frac{N-p}{N}\right)\begin{bmatrix}\zeta_{10}(t'_{-p}+\tau_{p+1}-\tau'_{p+1})\\-\zeta_{10}(t'_{-p})\end{bmatrix},$$ (64)

$$[\zeta_{10}(t)]_M^\dagger = -\zeta_{10}(t) + \frac{1}{N}\sum_{p=1}^{N} \zeta_{10}(t'_{-p}) - \left\{\begin{matrix}\zeta_{10}[t+(\tau_1-\tau_1')]\\-\zeta_{10}(t)\end{matrix}\right\} - \sum_{p=1}^{N-1}\left(\frac{N-p}{N}\right)\{\zeta_{10}[t'_{-p}+(\tau_{p+1}-\tau'_{p+1})] - \zeta_{10}(t'_{-p})\},$$ (65)

$$[\zeta_{10}(t)]_M^\dagger = -\zeta_{10}(t) + \frac{1}{N}\sum_{p=1}^{N}\zeta_{10}(t'_{-p}) - \sum_{p=0}^{N-1}\left(\frac{N-p}{N}\right)\{\zeta_{10}[t'_{-p}+(\tau_{p+1}-\tau'_{p+1})] - \zeta_{10}(t'_{-p})\},$$ (66)

$$[\zeta_{10}(t)]_M^\dagger = -\zeta_{10}(t) + \frac{1}{N}\sum_{p=1}^{N}\zeta_{10}(t'_{-p}) - \sum_{p=1}^{N}\left(\frac{N-p+1}{N}\right)\{\zeta_{10}[t'_{-p+1}+(\tau_p-\tau'_p)] - \zeta_{10}(t'_{-p+1})\}.$$ (67)

By selecting an appropriate value for $\tau_p$, the last term in Equation (67) can be made equal to zero in first order when considering the $x_{10}$ variation of $\tau(x_{10},y_{10},t)$. One way to select an appropriate value for $\tau_p$ is to select a global definition of $\tau_p$ instead of a local definition of $\tau_p$ such as expressed by Equation (22). Stated in the form of an integral, an appropriate global definition for $\tau_p$ is that value of $\tau_p$ such that $$\int \left\{\frac{d[\zeta_{10}(t_p)]}{dt}\right\}(\tau_p - \tau'_p)dx_{10} = 0.$$ (68)

where $\langle d[\zeta_{10}(t_p)]/dt\rangle$ represents the root mean average of $d[\zeta_{10}(t_p)]/dt$. With the global definition of Equation (68), the last term of the right hand side of Equation (67) enters as a second order term, i.e., the product of a first order in $(\tau_p-\tau_p')$ and a first order term in $\{d[\zeta_{10}(t_p)]/dt-\langle d[\zeta_{10}(t_p)]/dt\rangle\}$. Thus, the filter, i.e., Equation (20), for obtaining $\zeta_{10}(t)$ can be robust with respect to departures of $u(x_1,y_1,t)$ from a quantity that is independent of $x_1$ for a given value of $(y_1,t)$.

Similar results are by obtained for the effects of an incorrect value $\tau_p'$ for $\tau_p$ with respect to $[\zeta_1(t)]_M$ by the same type of analysis used to obtain the effects of an incorrect value $\tau_p'$ for $\tau_p$ with respect to $[\zeta_1(t)]_M$.

The foregoing discussion utilizes a series of earlier (and, in some cases, contemporaneous) phase measurements to determine the contribution of perturbations in refractivity to a measured phase. In some embodiments, an analysis utilizing an integral equation for determining of $\zeta_{10}(y_{10},t)$ may be used. In this approach, the contribution due to refractivity perturbations can be written in terms of a refractivity as $$\zeta_{10}(y_{10},t) = \int_{P_{10}}[n(x_{10},y_{10},t)-1]dx_{10},$$ (69)

$$\zeta_{10}(y_{10},t) = \int_{P_1}[n(x_1,y_1,t-\tau(x_1,y_1,t))-1]dx_1,$$ (70)

$$\zeta_{10}(y_{10},t) - \zeta(y_1,t) = \int_{P_1}[\delta(x_1,y_1,t-\tau(x_1,y_1,t)) - \delta(x_1,y_1,t)]dx_1,$$ (71)

where the integration in $x_1$ is over the measurement path $P_1$ of $x_1$ and $\delta$ is the refractivity $(n-1)$. Alternatively, one may write $$[\zeta_{10}(y_{10},t)-\zeta_1(y_1,t)]_{M2} = +\int_{P10} \{\delta(x_{10},y_{10},t) - \delta[x_{10},y_{10},t+\tau(x_{10},y_{10},t)]\}dx_{10}, \quad (72)$$

$$[\zeta_{10}(y_{10},t)-\zeta_1(y_1,t)]_{M2} = [\zeta_{10}(y_{10},t)-\zeta_{10}(y_1,t+\tau(t))]. \quad (73)$$

The quantity $\tau(x_{10},y_{10},t)$ is known using, for example, the results of a computational fluid dynamic code (CDF) and $[\zeta_{10}(y_{10},t)-\zeta_1(y_1,t)]_{M2}$ is determined according to $$[\zeta_{10}(t)-\zeta_1(t)]_{M2} = \frac{1}{4k}[\tilde{\varphi}_{10}(t)-\tilde{\varphi}_1(t)] - [Z_{10}(t)-Z_1(t)] - [x_{10}(t)-x_1(t)]. \quad (74)$$

Equation (73) is an integral equation that is subsequently inverted to obtain $$\int_{P10} \delta(x_{10},y_{10},t)dx_{10} \text{ and therefore } \zeta_{10}(y_{10},t).$$

For one inversion technique, it is noted that the right hand side of Equation (73) is in lowest order the first order time derivative of $\zeta_{10}(y_{10},t)$ as shown in the follow steps.

$$\int_{P10} \{\delta(x_{10},y_{10},t) - \delta[x_{10},y_{10},t+\tau(x_{10},y_{10},t)]\}dx_{10} = \\ -\int_{P10} \left[\frac{d\delta(x_{10},y_{10},t)}{dt}\tau(y_{10},t) + \frac{1}{2!}\frac{d^2\zeta_{10}(y_{10},t)}{dt^2}\tau^2(y_{10},t)+\ldots\right]dx_{10}, \quad (75)$$

$$\int_{P10} \{\delta(x_{10},y_{10},t) - \delta[x_{10},y_{10},t+\tau(x_{10},y_{10},t)]\}dx_{10} = \\ -\tau(y_{10},t)\int_{P10} \frac{d\delta(x_{10},y_{10},t)}{dt}dx_{10} - \frac{\tau^2(y_{10},t)}{2!}\int_{P10} \frac{d^2\delta(x_{10},y_{10},t)}{dt^2}dx_{10}+\ldots, \quad (76)$$

$$\int_{P10} \{\delta(x_{10},y_{10},t) - \delta[x_{10},y_{10},t+\tau(x_{10},y_{10},t)]\}dx_{10} = \\ -\tau(y_{10},t)\frac{d\zeta_{10}(x_{10},y_{10},t)}{dt} - \frac{1}{2!}\frac{d^2\zeta_{10}(y_{10},t)}{dt^2}\tau^2(y_{10},t)+\ldots. \quad (77)$$

Combining Equations (72) and (77), $$[\zeta_{10}(y_{10},t)-\zeta_1(y_1,t)]_{M2} = -\tau(y_{10},t)\frac{d\zeta_{10}(x_{10},y_{10},t)}{dt} - \frac{1}{2!}\frac{d^2\zeta_{10}(y_{10},t)}{dt^2}\tau^2(y_{10},t)+\ldots. \quad (78)$$

Equation (78) may be used to invert Equation (73) by an iterative procedure such as described in commonly owned U.S. Pat. No. 6,137,574 entitled "SYSTEMS AND METHODS FOR CHARACTERIZING AND CORRECTING CYCLIC ERRORS IN DISTANCE MEASURING AND DISPERSION INTERFEROMETRY;" U.S. Pat. No. 6,252,668 B1 entitled "SYSTEMS AND METHODS FOR QUANTIFYING NON-LINEARITIES IN INTERFEROMETRY SYSTEMS;" and U.S. Pat. No. 6,246,481 entitled "SYSTEMS AND METHODS FOR QUALIFYING NON-LINEARITIES IN INTERFEROMETRY SYSTEMS" wherein all three are by Henry A. Hill, the contents of the three above-cited patents are herein incorporated in their entirety by reference. The constant of integration that results from the inversion of Equation (73) can be chosen such that the average of the constant of integration over a given interval of time is zero, i.e., $\zeta_{10}(y_{10},t)$ should be independent of the value selected for $t_1$.

Alternatively, or additionally, Equation (78) can be solved using other methods for solving differential equations known in the art.

In some embodiments, the effect of refractivity perturbations can be determined according to an integral transform. For example, an integral transform of $\zeta_{10}(t)$ is defined as $$I(\zeta_{10},t) = \frac{1}{\sqrt{2\pi}}\int_{-\infty}^{t} \zeta_{10}(t')\exp\{j\omega t'\}dt', \quad (79)$$

where $j=\sqrt{(-1)}$. Integral transform $I(\zeta_{10},t)$ can be written in terms of integral transform $I(\zeta_1,t)$ as demonstrated in the following sequence of equations.

$$I(\zeta_{10},t) = \frac{1}{\sqrt{2\pi}}\int_{P_1} dx_1 \int_{-\infty}^{t} \{n[x_1,y_1,t'-\tau(x_1,y_1,t')]-1\}\exp\{j\omega t'\}dt', \quad (80)$$

Continuing with the next steps, $$I(\zeta_{10},t) = \\ \frac{1}{\sqrt{2\pi}}\int_{-\infty}^{t} \exp\{j\omega[t'']\}dt'' \int_{P_1} [n(x_1 y_1, t''-\tau(x_1 y_1,t''))-1]dx_1, \quad (81)$$

$$I(\zeta_{10},t) = \\ \frac{1}{\sqrt{2\pi}}\exp[j\omega\tau(t)]\int_{P_1} dx_1 \int_{-\infty}^{t-\tau} \{n[x_1,y_1,t'']-1\}\exp\{j\omega t''\}dt''. \quad (82)$$

If $\tau$ is independent of $x_1$, then $$I(\zeta_{10},t) = \frac{1}{\sqrt{2\pi}}\int_{-\infty}^{t-\tau} \{\zeta_1(t'')\exp[j\omega\tau(t'')]\}\exp\{j\omega t''\}dt''. \quad (83)$$

As in the foregoing analysis (see discussion relating to Equation (68)), errors introduced by the assumption that $\tau$ is independent of $x_1$ enter as second order terms. For $\tau(x,y,t)$ equal to a constant $\tau_0$, Equation (83) reduces to $$I(\zeta_{10},t) = \exp(j\omega\tau_0)I(\zeta_1,t-\tau). \quad (84)$$

In non-contemporaneous applications, because data is collected at times subsequent to the time of interest, the integration limit, t, in Equation (83) can be extended to $\infty$. When $t \Rightarrow \infty$ in Equation (83), integral transform $I(\zeta_{10},t)$ reduces to a Fredholm integral equation. Accordingly, $$F(\zeta_{10}) = \frac{1}{\sqrt{2\pi}} \int_{-\infty}^{\infty} \{\zeta_1(t'') \exp[j\omega\tau(t'')]\} \exp\{j\omega t''\} dt'', \quad (85)$$

$$F(\zeta_{10} - \zeta_1) = \frac{1}{\sqrt{2\pi}} \int_{-\infty}^{\infty} \zeta_1(t'') \{\exp[j\omega\tau(t'')] - 1\} \exp\{j\omega t''\} dt'', \quad (86)$$

$$\frac{1}{\sqrt{2\pi}} \int_{-\infty}^{\infty} [\zeta_{10}(t'') - \zeta_1(t'')] \exp\{j\omega t''\} dt'' = \quad (87)$$
$$+ \frac{1}{\sqrt{2\pi}} \int_{-\infty}^{\infty} \zeta_1(t'') \{\exp[j\omega\tau(t'')] - 1\} \exp\{j\omega t''\} dt'',$$

$$[\zeta_{10}(t) - \zeta_1(t)] = \quad (88)$$
$$+ \frac{1}{2\pi} \int_{-\infty}^{\infty} \exp(-j\omega\tau) d\omega \int_{-\infty}^{\infty} \zeta_1(t'') \{\exp[j\omega\tau(t'')] - 1\} \exp\{j\omega t''\} dt'',$$

$$[\zeta_{10}(t) - \zeta_1(t)] = \quad (89)$$
$$+ \frac{1}{2\pi} \int_{-\infty}^{\infty} \zeta_1(t'') dt'' \int_{-\infty}^{\infty} \{\exp[j\omega\tau(t'')] - 1\} \exp\{j\omega(t'' - t)\} d\omega,$$

$$[\zeta_{10}(t) - \zeta_1(t)] = \int_{-\infty}^{\infty} \zeta_1(t'') K(t'', t) dt'', \quad (90)$$

where kernel $K(t'',t)$ is $$K(t'', t) = \frac{1}{2\pi} \int_{-\infty}^{\infty} \{\exp[j\omega\tau(t'')] - 1\} \exp\{j\omega(t'' - t)\} d\omega. \quad (91)$$

Equation (90) is a Fredholm integral equation of the first kind (see e.g., "Mathematical Methods for Physics," 5$^{th}$ Ed., by G. Arfken and H.-J. Weber and available from Harcourt/Academic Press) that can be used to compute $\zeta_1(t)$ from measured quantity $[\zeta_{10}(t)-\zeta_1(t)]_M$ and known quantity $\tau(t)$. Quantity $\tau(t)$ is known using, for example, the results of a computational fluid dynamic code (CDF) and $[\zeta_{10}(t)-\zeta_1(t)]_M$ is a measured quantity.

A Fredholm integral equation of the determination of $\zeta_{10}(t)$ is next developed. The integral transform of $\zeta_1(t)$ is obtained using Equations (22) and (85) as $$F(\zeta_1) = \frac{1}{\sqrt{2\pi}} \int_{-\infty}^{\infty} \{\zeta_{10}(t'') \exp[-j\omega\tau(t'')]\} \exp\{j\omega t''\} dt''. \quad (92)$$

Subtracting Equation (92) from Equation (85), $$F(\zeta_{10} - \zeta_1) = \frac{1}{\sqrt{2\pi}} \int_{-\infty}^{\infty} \zeta_{10}(t'') \{1 - \exp[-j\omega\tau(t'')]\} \exp\{j\omega t''\} dt'', \quad (93)$$

$$\frac{1}{\sqrt{2\pi}} \int_{-\infty}^{\infty} [\zeta_{10}(t'') - \zeta_1(t'')] \exp\{j\omega t''\} dt'' = \quad (94)$$
$$\frac{1}{\sqrt{2\pi}} \int_{-\infty}^{\infty} \zeta_{10}(t'') \{1 - \exp[-j\omega\tau(t'')]\} \exp\{j\omega t''\} dt'',$$

$$[\zeta_{10}(t) - \zeta_1(t)] = \quad (95)$$
$$+ \frac{1}{2\pi} \int_{-\infty}^{\infty} \exp(-j\omega\tau) d\omega \int_{-\infty}^{\infty} \zeta_{10}(t'') \{1 - \exp[-j\omega\tau(t'')]\} \exp\{j\omega t''\} dt'',$$

$$[\zeta_{10}(t) - \zeta_1(t)] = \quad (96)$$
$$+ \frac{1}{2\pi} \int_{-\infty}^{\infty} \zeta_{10}(t'') dt'' \int_{-\infty}^{\infty} \{1 - \exp[-j\omega\tau(t'')]\} \exp\{j\omega(t'' - t)\} d\omega,$$

$$[\zeta_{10}(t) - \zeta_1(t)] = \int_{-\infty}^{\infty} \zeta_{10}(t'') K'(t'', t) dt'', \quad (97)$$
where $$K'(t'', t) = \frac{1}{2\pi} \int_{-\infty}^{\infty} \{1 - \exp[-j\omega\tau(t'')]\} \exp\{j\omega(t'' - t)\} d\omega. \quad (98)$$

Equation (97) is a Fredholm integral equation of the first kind (see, e.g., "Mathematical Methods for Physics" by G. Arfken and H.-J. Weber) that can be used to compute $\zeta_{10}(t)$ from measured quantity $[\zeta_{10}(t)-\zeta_1(t)]_M$ and known quantity $\tau(t)$. Quantity $\tau(t)$ is known using for example as previously cited the results of a computational fluid dynamic code (CDF).

The values of $\zeta_1(t)$ and $\zeta_{10}(t)$ obtained from the inversion of Equations (90) and (97), respectively, can be used to compensate for effects of gas turbulence in a non-contemporaneous mode application, such as may be encountered in determining alignment mark locations.

The effects of refractivity perturbations in the actual position and/or angular orientation and/or measured position and/or angular orientation of the wafer stage may affect the accuracy of overlays on a wafer placed on the wafer stage as previously noted. The accuracy of alignment mark determinations that are used in making the overlays can also be affected by the refractivity perturbations. Alignment mark locations are determined in lithography tools by an alignment scope. When the alignment scope is located off axis, i.e., displaced from the measurement axes of an interferometer system used in conjunction with the alignment scope, the refractivity perturbations in the measured and actual angular orientation of the wafer stage generate refractivity perturbations in the location of the alignment marks as determined by the off-axis alignment scope and interferometer system.

The effect of refractivity perturbations in the determined location of alignment marks are generally larger then the effect of refractivity perturbations in the individual linear displacement interferometric measurements used to determine changes in the angular orientation of the stage when the alignment scope is displaced from the axes of the interferometer system. The foregoing methods can be used to reduce the effects of refractivity perturbations when determining alignment mark locations.

Figure 3:
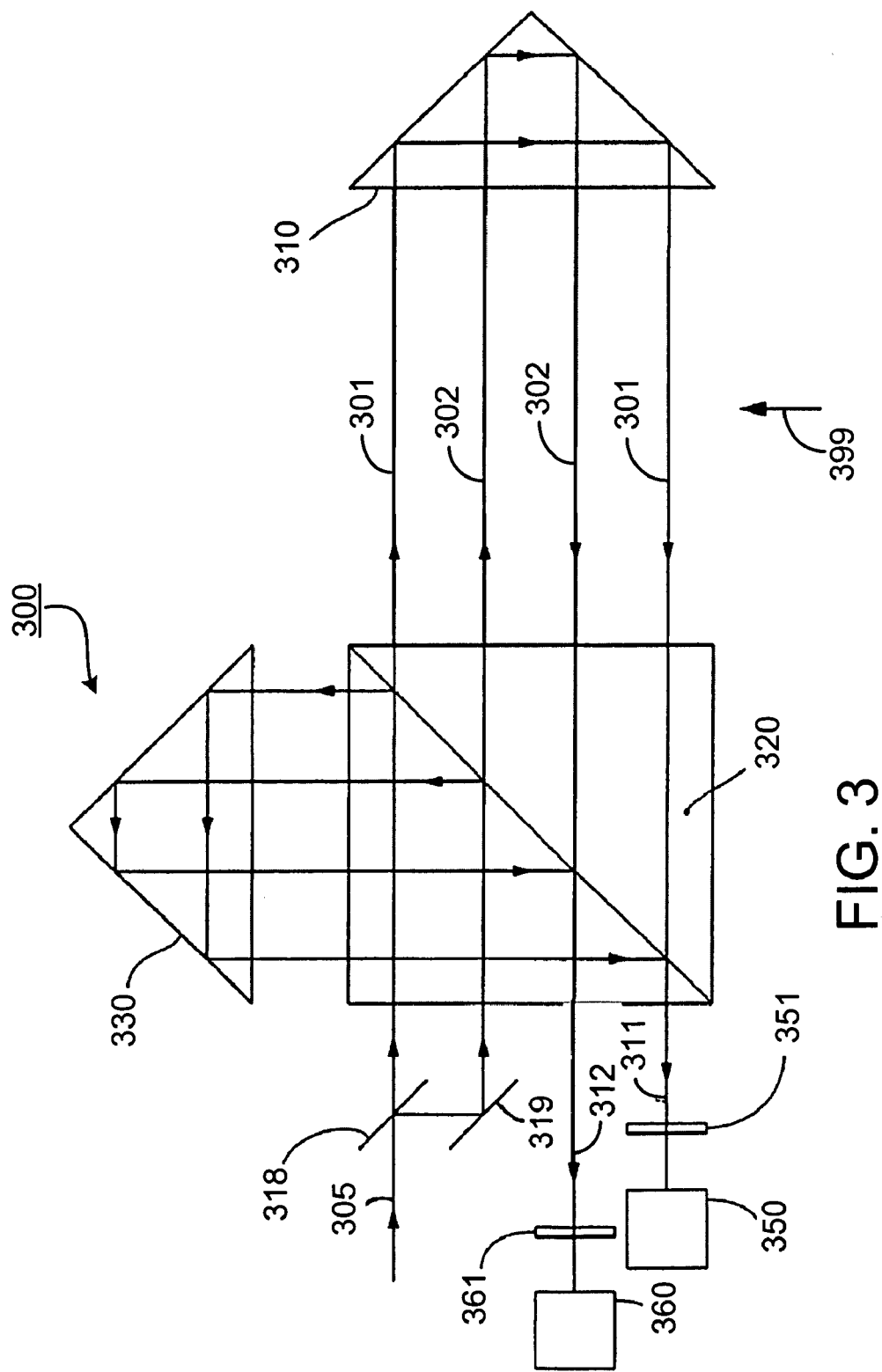
FIG. 3 is a schematic diagram of another embodiment of a multi-axis interferometer.

Although the multi-axis interferometers described above produce measurement beams with non-overlapping paths, the methods disclosed herein can be extended to multi-axis interferometers that produce other measurement beam path geometries (e.g., having overlapping measurement beam paths). For example, referring to FIG. 3, a multi-axis interferometer 300 produces two measurement beams, 301 and 302, having overlapping paths. Multi-axis interferometer 300 measures the linear displacement of a retroreflector measurement object 310 along coextensive measurement axes.

Multi-axis interferometer includes a polarizing beam splitting interface 320, a reference retroreflector 330, and two detectors 350 and 360. A non-polarizing beam splitter 318 and mirror 319 derive two input beams from an initial beam 305. Analyzers 351 and 361 respectively sample a polarization state of exiting beams 311 and 312 before their detection.

The gas flow direction, indicated by arrow 399, is generally orthogonal to the direction of the respective measurement beam paths such that a refractivity perturbation (due to, e.g., a turbulent gas cell) that passes through a first component of a first measurement beam path subsequently passes through two measurement beam components of the second interferometer and then passes through a second component of the measurement beam of the first interferometer. The effects of refractivity perturbations on the difference of the measured optical path lengths of the two interferometers at a single wavelength are processed to furnish a correction to the measured optical path lengths for the effects of refractivity perturbations.

Processing measured effects of refractivity perturbations can include adapting the previously discussed techniques. For example, adapting Equation (73) to the present embodiment takes the form $$[\zeta_{41}(y_{41},t) - \zeta_{31}(y_{31},t) - \zeta_{21}(y_{21},t) + \zeta_{11}(y_{11},t)]_{M2} = \quad (99)$$
$$+ \begin{bmatrix} \zeta_{41}(y_{41},t) - \zeta_{31}(y_{31},t+\tilde{\tau}_1) \\ -\zeta_{21}(y_{21},t+\tilde{\tau}_1+\tilde{\tau}_2) + \zeta_1(y_{11},t+\tilde{\tau}_1+\tilde{\tau}_2+\tilde{\tau}_1) \end{bmatrix}$$

where $\tilde{\tau}_1$ and $\tilde{\tau}_2$ are the transit times for the gas cells to move from beams at $(x_{31},y_{31},t)$ to $(x_{41},y_{41},t)$ and from beams at $(x_{21},y_{21},t)$ to $(x_{31},y_{31},t)$, respectively. Due to the symmetry of the beam paths, the time interval for gas cells to move from beams at $(x_{31},y_{31},t)$ to $(x_{41},y_{41},t)$ is the same as the time for the gas cells to move from beams at $(x_{11},y_{11},t)$ to $(x_{21},y_{21},t)$. The gas turbulent effects for beams at $(y_{41},t)$, $(y_{31},t)$, $(y_{21},t)$, and $(y_{11},t)$ are $\zeta_{41}(x_{41},y_{41},t)$, $\zeta_{31}(y_{31},t)$, $\zeta_{21}(y_{21},t)$, and $\tau_{11}(y_{11},t)$, respectively.

The quantities $\tilde{\tau}_1$ and $\tilde{\tau}_2$ are determined using, for example, the results of a computational fluid dynamic code (CDF) and $[\zeta_{41}(y_{41},t) - \zeta_{31}(y_{31},t) - \zeta_{21}(y_{21},t) + \zeta_{11}(y_{11},t)]_{M2}$ is a measured quantity. Equation (99) is an integral equation that can be subsequently inverted to obtain $\zeta_{41}(y_{41},t)$.

Analogously to Equation (78), the right hand side of Equation (99) is in lowest order the second order time derivative of $\zeta_{41}(y_{41},t)$. Other transforms may be developed to determine the effects of refractivity perturbations similar to the transforms discussed previously.

Embodiments of the interferometry techniques described herein may include compensation for the effects of other error sources. For example, the effect of cyclic non-linear errors can be reduced in embodiments of the present invention for example by techniques such as described in commonly owned U.S. patent application Ser. No. 10/097,365, entitled "CYCLIC ERROR REDUCTION IN AVERAGE INTERFEROMETRIC MEASUREMENTS" and U.S. patent application Ser. No. 10/616,504, entitled "CYCLIC ERROR COMPENSATION IN INTERFEROMETRY SYSTEMS," both of which are by Henry A. Hill, the contents of which are incorporated herein in their entirety by reference.

An example of another cyclic error compensation technique that may be included in the described systems is described in commonly owned published U.S. patent application No. 2003-0095265-A1, having Ser. No. 10/287,898, and entitled "INTERFEROMETRIC CYCLIC ERROR COMPENSATION," by Henry A. Hill, the contents of which are incorporated herein in their entirety by reference.

A further example of a cyclic error compensation technique is described in commonly owned U.S. Patent Application Publication No. 20030007156, with Ser. No. 10/174,149, entitled "INTERFEROMETRY SYSTEM AND METHOD EMPLOYING AN ANGULAR DIFFERENCE IN PROPAGATION BETWEEN ORTHOGONALLY POLARIZED INPUT BEAM COMPONENTS," filed on Jan. 9, 2003, by Henry A. Hill and Peter de Groot, the contents of which are incorporated herein in their entirety by reference.

Another example of a cyclic error compensation technique that may be included in the described systems is described in commonly owned U.S. Patent Application Publication No. 20030038947, with Ser. No. 10/218,965, entitled "TILTED INTERFEROMETER," filed on Feb. 27, 2003, by Henry A. Hill, the contents of which are herein incorporated in their entirety by reference.

Further examples of techniques for cyclic error compensation include those described in cited U.S. Pat. No. 6,137, 574, U.S. Pat. No. 6,252,668 B1, and U.S. Pat. No. 6,246, 481, the contents of which are hereby incorporated by reference in their entirety.

The interferometry systems and methods described herein provide highly accurate measurements. Such systems and methods can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p.82 (1997).

Overlay depends directly on the performance, i.e., accuracy and precision, of the distance measuring interferometers used to position the wafer and reticle (or mask) stages. Since a lithography tool may produce $50-100M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system in which the interferometry system is attached to, or supported by one of the components and the measurement object is attached, or is supported by the other of the components.

Figure 4:
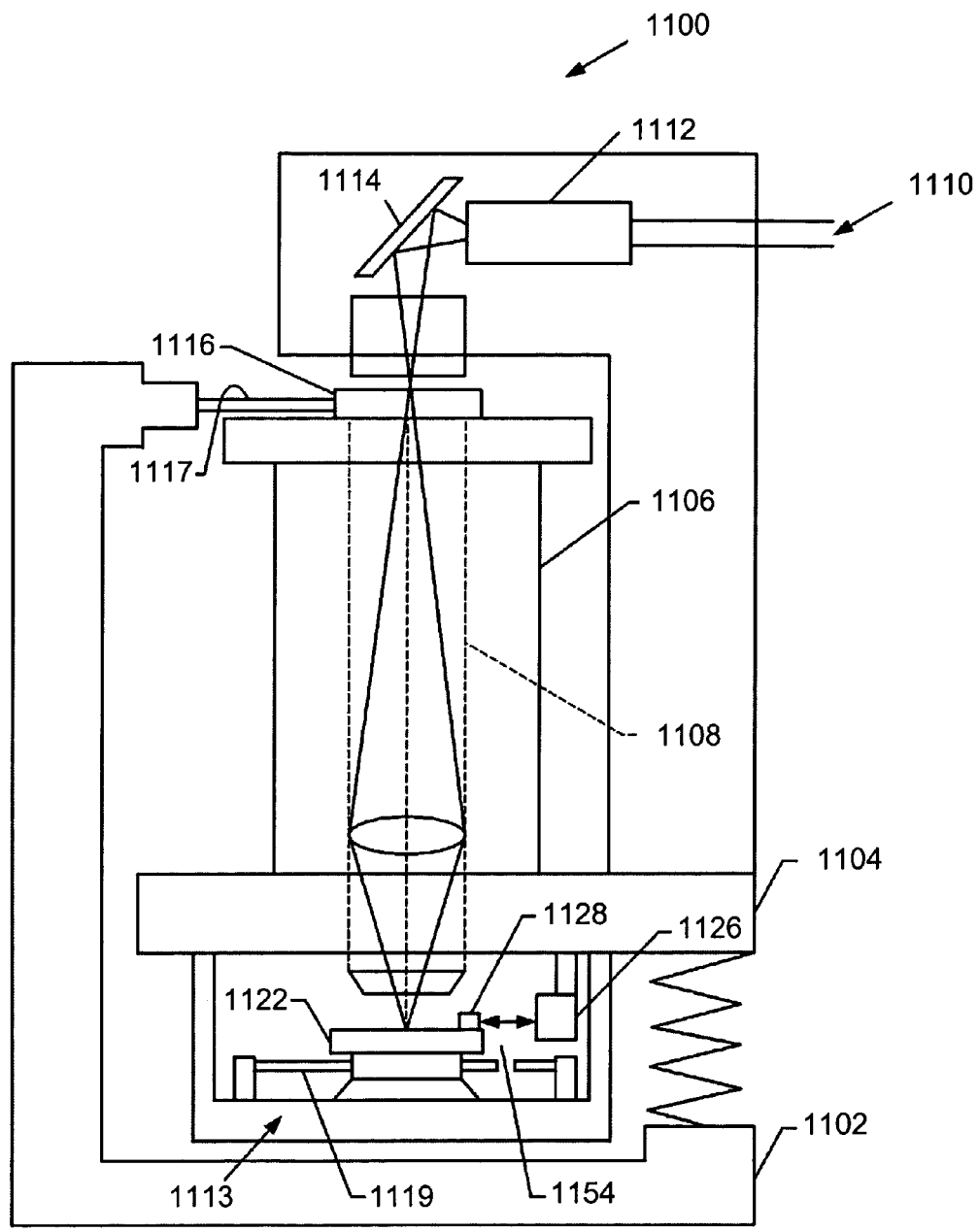
FIG. 4 is a schematic diagram of an embodiment of a lithography tool that includes an interferometer.

An example of a lithography scanner 1100 using an interferometry system 1126 is shown in FIG. 4. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 5A:
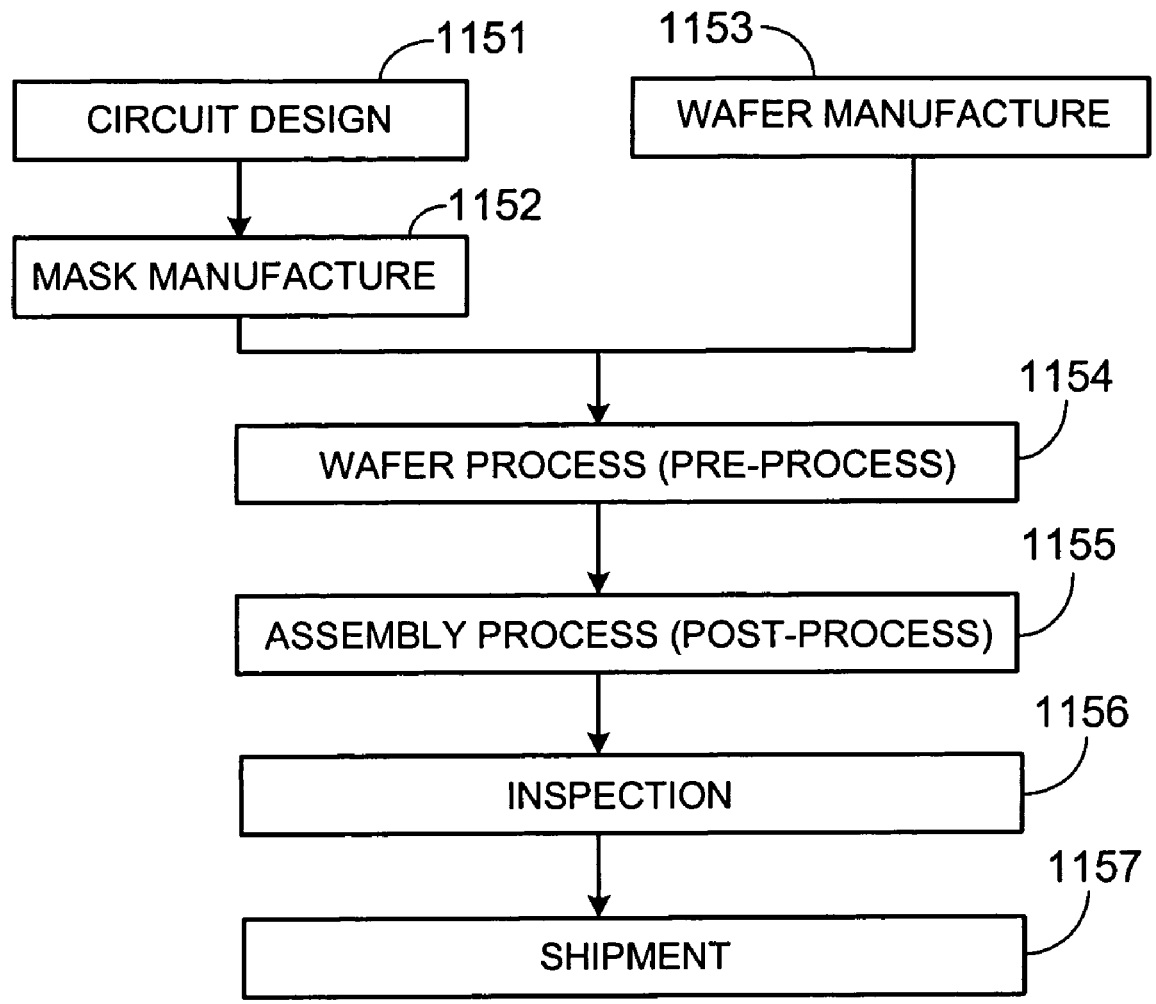
FIG. 5A and FIG. 5B are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 5A and 5B. FIG. 5A is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing).

Step 1156 is an inspection step wherein operability check, durability check and so on of the semiconductor devices produced by step 1155 are carried out. With these processes, semiconductor devices are finished and they are shipped (step 1157).

Figure 5B:
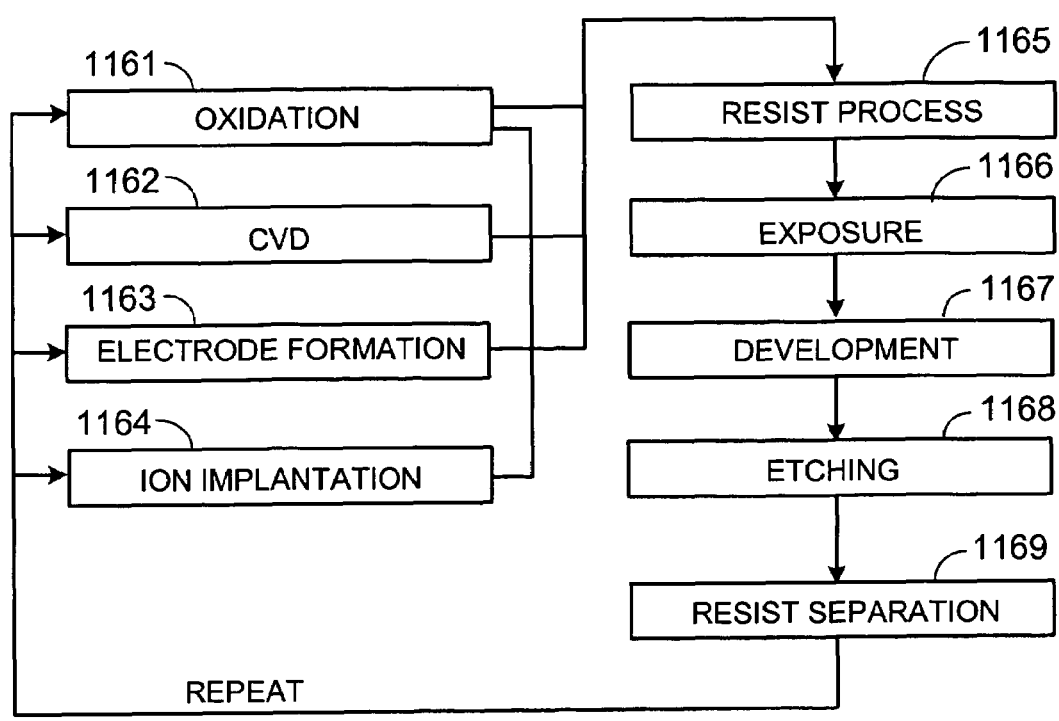

FIG. 5B is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described previously. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate anti write beam.

Figure 6:
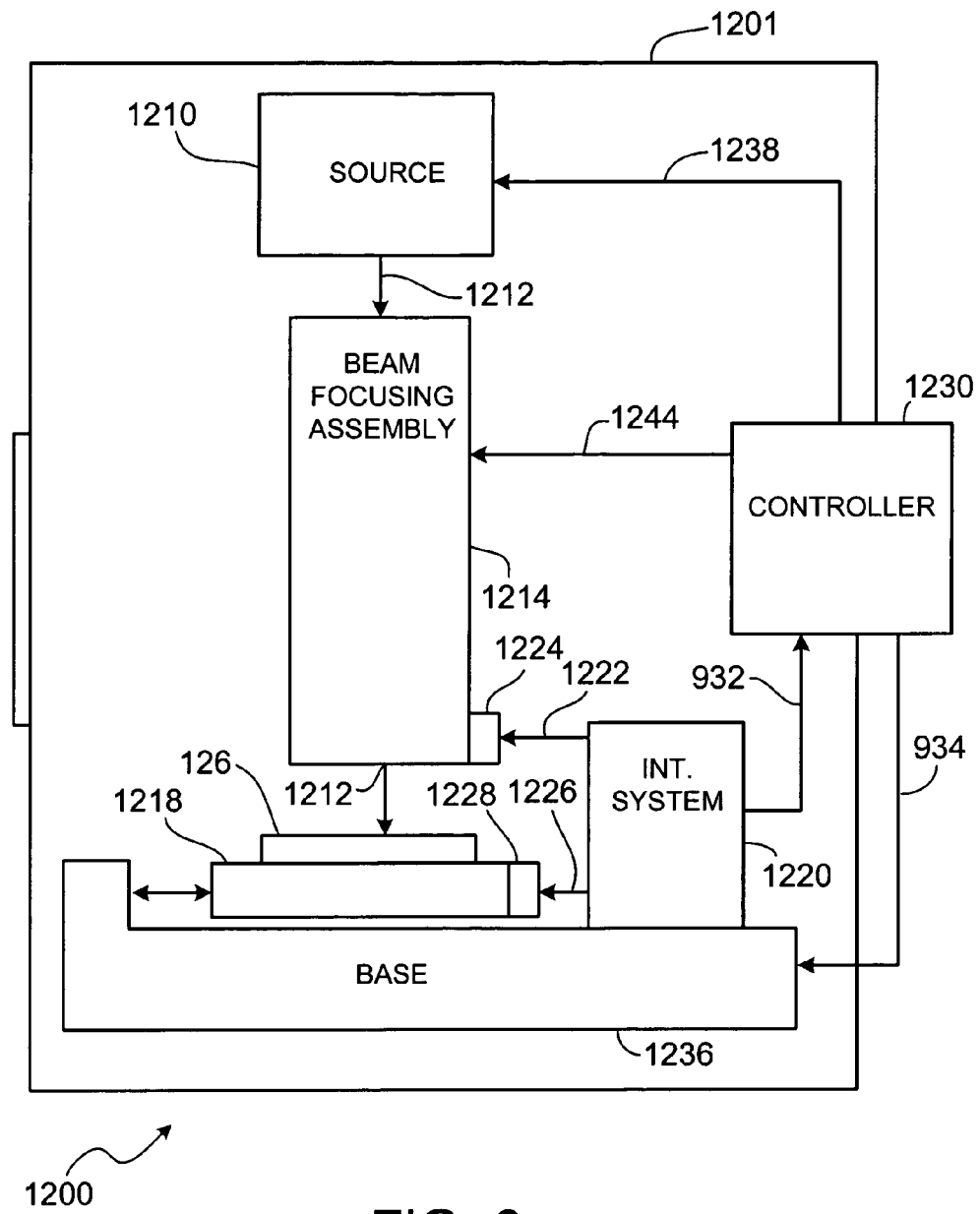
FIG. 6 is a schematic diagram of a beam writing system that includes an interferometry system.

As an example, a schematic of a beam writing system 1200 is shown in FIG. 6. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g. x-ray-UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. For example, although the described embodiments include multi-axis interferometers that utilize common optical components, in other embodiments a multi-axis interferometer can include multiple appropriately configured single-axis interferometers each having separate optical components. Accordingly, other embodiments are within the scope of the following claims.

What is claimed is:

1. A method, comprising:
   directing a first measurement beam along a first path contacting a measurement object to determine a first interferometric phase related to a position of a measurement object;
   directing a second measurement beam along a second path contacting the measurement object to determine a second interferometric phase related to the position of the measurement object;
   determining a contribution to the first interferometric phase due to perturbations in refractivity along the first path based on the second interferometric phase,
   wherein the contribution to the first interferometric phase due to perturbations in refractivity at a first time is related to a contribution to the second interferometric phase due to perturbations in refractivity at a second time different from the first time and a difference between the first time and the second time is related to a velocity of a gas in the first path; and
   adjusting a relative position between the measurement object and another object based on the determined contribution.

2. The method of claim 1, wherein the position of the measurement object changes from the first time to the second time.

3. The method of claim 1, wherein the first path and second path are non-parallel to a direction of gas flow in the first path.

4. The method of claim 3, wherein the first path and second path are substantially parallel.

5. The method of claim 4, wherein the first path and second path are substantially orthogonal to the direction of gas flow in the first path.

6. The method of claim 1, wherein determining the contribution to the first interferometric phase due to perturbations in refractivity comprises determining a difference between the first interferometric phase and the second interferometric phase.

7. A method, comprising:
   directing a first measurement beam along a first path contacting a measurement object to determine a first interferometric phase related to a position of a measurement object;
   directing a second measurement beam along a second path contacting the measurement object to determine an a second interferometric phase related to the position of the measurement object;
   determining a contribution to the first interferometric phase due to perturbations in refractivity along the first path based on the second interferometric phase,
   wherein determining the contribution to the first interferometric phase due to perturbations in refractivity comprises determining a difference between the first interferometric phase and the second interferometric phase and correcting the difference between the first interferometric phase and the second interferometric phase for variations in an angular orientation of the measurement object; and
   adjusting a relative position between the measurement object and another object based on the determined contribution.

8. A method, comprising:
   directing a first measurement beam along a first path contacting a measurement object to determine a first interferometric phase related to a position of a measurement object;
   directing a second measurement beam along a second path contacting the measurement object to determine an a second interferometric phase related to the position of the measurement object;
   determining a contribution to the first interferometric phase due to perturbations in refractivity along the first path based on the second interferometric phase,
   wherein determining the contribution to the first interferometric phase due to perturbations in refractivity comprises determining a difference between the first interferometric phase and the second interferometric phase and summing the differences of first and second interferometric phases determined for different times; and
   adjusting a relative position between the measurement object and another object based on the determined contribution.

9. The method of claim 8, wherein the different times are related to a velocity of a gas in the first path.

10. The method of claim 8, wherein the different times are related to a separation between the first path and the second path.

11. The method of claim 6, wherein a difference between the contribution to the first interferometric phase due to perturbations in refractivity and a contribution to the second interferometric phase due to perturbations in refractivity is proportional to the difference between the first interferometric phase and the second interferometric phase.

12. A method, comprising:
   directing a first measurement beam along a first path contacting a measurement object to determine a first interferometric phase related to a position of a measurement object;

directing a second measurement beam along a second path contacting the measurement object to determine an a second interferometric phase related to the position of the measurement object;

determining a contribution to the first interferometric phase due to perturbations in refractivity along the first path based on the second interferometric phase, wherein determining the contribution to the first interferometric phase comprises determining a difference between the first interferometric phase and the second interferometric phase and determining a parameter related to the difference between the contribution to the first interferometric phase and a contribution to the second interferometric phase due to perturbations in refractivity based on the difference between the first interferometric phase and the second interferometric phase; and adjusting a relative position between the measurement object and another object based on the determined contribution.

13. The method of claim 12, wherein the contribution to the first interferometric phase is determined based on an integral relationship between the parameter and the contribution.

14. The method of claim 13, wherein the integral relationship is based on a Fredholm integral relationship.

15. The method of claim 6, wherein the contribution to the first interferometric phase due to perturbations in refractivity is determined based on variations in the angular orientation of the measurement object.

16. The method of claim 15, wherein variations in the angular orientation of the measurement object are measured simultaneously to determine the first and second interferometric phases.

17. The method of claim 15, wherein variations in the angular orientation of the measurement object are measured using one or more interferometers.

18. A method, comprising:

directing a first measurement beam along a first path contacting a measurement object to determine a first interferometric phase related to a position of a measurement object;

directing a second measurement beam along a second path contacting the measurement object to determine an a second interferometric phase related to the position of the measurement object;

determining a contribution to the first interferometric phase due to perturbations in refractivity along the first path based on the second interferometric phase, wherein determining the contribution to the first interferometric phase comprises determining a difference between the first interferometric phase and the second interferometric phase based on variations in the angular orientation of the measurement object and the variations in the angular orientation of the measurement object are measured using one or more interferometers direct respective measurement beams along measurement paths substantially non-orthogonal to a gas flow direction; and adjusting a relative position between the measurement object and another object based on the determined contribution.

19. The method of claim 18, wherein the measurement paths are substantially parallel to the gas flow direction.

20. The method of claim 17, wherein the one or more interferometers include a multi-axis interferometer.

21. A method, comprising:

directing a first measurement beam along a first path contacting a measurement object to determine a first interferometric phase related to a position of a measurement object;

directing a second measurement beam along a second path contacting the measurement object to determine an a second interferometric phase related to the position of the measurement object; and determining a contribution to the first interferometric phase due to perturbations in refractivity along the first path based on the second interferometric phase and compensating the first interferometric phase for contributions due to non-perturbative variations in refractivity.

22. The method of claim 1, wherein the contribution to the first interferometric phase due to perturbations in refractivity is determined contemporaneously to determining the first interferometric phase.

23. The method of claim 1, wherein the contribution to the first interferometric phase due to perturbations in refractivity is determined non-contemporaneously to determining the first interferometric phase.

24. An apparatus, comprising:

an interferometry system which during operation directs a first measurement beam along a first path contacting a measurement object, directs a second measurement beam along a second path contacting the measurement object, and directs a third measurement beam along a third path to contact a second measurement object; and an electronic controller which during operation determines a first and second interferometric phase related to a position of the measurement object based on the first and second measurement beams, respectively, determines a contribution to the first interferometric phase due to perturbations in refractivity along the first path based on the second interferometric phase, determines a third phase related to a position of the second measurement object, and monitors variations in an angular orientation of the measurement object based on the third interferometric phase.

25. The apparatus of claim 24, wherein the interferometry system comprises a multi-axis interferometer which during operation directs the first and second measurement beams along the first and second measurement paths.

26. The apparatus of claim 24, wherein the first path is substantially parallel to the second path.

27. The apparatus of claim 24, further comprises a gas source which during operation causes gas to flow through the first and second measurement paths.

28. The apparatus of claim 27, wherein the direction of gas flow is substantially non-parallel to the first and second measurement paths.

29. The apparatus of claim 28, wherein the direction of gas flow is substantially orthogonal to the first and second measurement paths.

30. The apparatus of claim 24, wherein the third path is substantially non-parallel to the first path.

31. The apparatus of claim 30, wherein the third path is substantially orthogonal to the first path.

32. The apparatus of claim 24, wherein the measurement object is mounted on a stage which is moveable relative to the interferometry system.

33. The apparatus of claim 24, wherein the measurement object comprises a plane mirror.

34. The apparatus of claim 24, wherein the measurement object comprises a retroreflector.

35. A lithography system for use in fabricating integrated circuits on a wafer, the system comprising:
a stage for supporting the wafer;
an illumination system for imaging spatially patterned radiation onto the wafer;
a positioning system for adjusting the position of the stage relative to the imaged radiation; and
the apparatus of claim 24 for monitoring the position of the wafer relative to the imaged radiation.

36. A lithography system for use in fabricating integrated circuits on a wafer, the system comprising:
a stage for supporting the wafer; and
an illumination system including a radiation source, a mask, a positioning system, a lens assembly, and the apparatus of claim 24,
wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

37. A beam writing system for use in fabricating a lithography mask, the system comprising:
a source providing a write beam to pattern a substrate;
a stage supporting the substrate;
a beam directing assembly for delivering the write beam to the substrate;
a positioning system for positioning the stage and beam directing assembly relative one another; and
the apparatus of claim 24 for monitoring the position of the stage relative to the beam directing assembly.

38. A lithography method for use in fabricating integrated circuits on a wafer, the method comprising:
supporting the wafer on a moveable stage;
imaging spatially patterned radiation onto the wafer;
adjusting the position of the stage; and
monitoring the position of the stage using the method of claim 1.

39. A lithography method for use in the fabrication of integrated circuits comprising:
directing input radiation through a mask to produce spatially patterned radiation;
positioning the mask relative to the input radiation;
monitoring the position of the mask relative to the input radiation using the method of claim 1; and
imaging the spatially patterned radiation onto a wafer.

40. A lithography method for fabricating integrated circuits on a wafer comprising:
positioning a first component of a lithography system relative to a second component of a lithography system to expose the wafer to spatially patterned radiation; and
monitoring the position of the first component relative to the second component using the method of claim 1.

41. A method for fabricating integrated circuits, the method comprising:
applying a resist to a wafer;
forming a pattern of a mask in the resist by exposing the wafer to radiation using the lithography method of claim 38; and
producing an integrated circuit from the wafer.

42. A method for fabricating integrated circuits, the method comprising:
applying a resist to a wafer;
forming a pattern of a mask in the resist by exposing the wafer to radiation using the lithography method of claim 39; and
producing an integrated circuit from the wafer.

43. A method for fabricating integrated circuits, the method comprising:
applying a resist to a wafer;
forming a pattern of a mask in the resist by exposing the wafer to radiation using the lithography method of claim 40; and
producing an integrated circuit from the wafer.

44. A method for fabricating integrated circuits, the method comprising using the lithography system of claim 36 to direct spatially patterned radiation towards the wafer while monitoring the position of the wafer,
wherein monitoring the position of the wafer comprises accounting for the contribution to the first interferometric phase due to perturbations in refractivity along the first path.

45. A method for fabricating integrated circuits, the method comprising using the lithography system of claim 36 producing spatially patterned radiation using the mask while monitoring the position of the mask,
wherein monitoring the position of the mask comprises accounting for the contribution to the first interferometric phase due to perturbations in refractivity along the first path.

46. A method for fabricating a lithography mask, the method comprising:
directing a write beam to a substrate to pattern the substrate;
positioning the substrate relative to the write beam; and
monitoring the position of the substrate relative to the write beam using the interferometry method of claim 1.

47. The method of claim 1, wherein the first and second paths are different.

48. The method of claim 24, wherein the first and second paths are different.

49. A method, comprising:
directing a first measurement beam along a first path contacting a measurement object to determine a first interferometric phase at a first time related to a position of a measurement object at the first time;
directing a second measurement beam along a second path contacting the measurement object to determine a second interferometric phase related to the position of the measurement object;
determining a contribution to the first interferometric phase due to a perturbation in refractivity along the first path at the first time based on the second interferometric phase,
wherein the first and second measurement beams have the same wavelength; and
adjusting a relative position between the measurement object and another object based on the determined contribution.

50. An apparatus, comprising:
a light source which during operation produces radiation at a first wavelength;
an interferometry system which during operation receives radiation from the light source, directs a first measurement beam at the first wavelength along a first path contacting a measurement object, and directs a second measurement beam at the first wavelength along a second path contacting the measurement object; and an electronic controller which during operation determines a first and second interferometric phase related to a position of the measurement object based on the first and second measurement beams, respectively, and determines a contribution to the first interferometric phase at a first time due to a perturbation in refractivity along the first path at the first time based on the second interferometric phase.

51. An apparatus, comprising:

an interferometry system which during operation directs a first measurement beam along a first path contacting a measurement object and directs a second measurement beam along a second path contacting the measurement object; and an electronic controller which during operation determines a first and second interferometric phase related to a position of the measurement object based on the first and second measurement beams, respectively, and determines a contribution to the first interferometric phase due to perturbations in refractivity along the first path based on the second interferometric phase and a velocity of the gas in the first path.

52. The method of claim 1, wherein adjusting the relative position of the measurement object and the other object comprises outputting a signal based on the contribution.

53. The method of claim 7, wherein adjusting the relative position of the measurement object and the other object comprises outputting a signal based on the contribution.

54. The method of claim 8, wherein adjusting the relative position of the measurement object and the other object comprises outputting a signal based on the contribution.

55. The method of claim 12, wherein adjusting the relative position of the measurement object and the other object comprises outputting a signal based on the contribution.

56. The method of claim 18, wherein adjusting the relative position of the measurement object and the other object comprises outputting a signal based on the contribution.

57. The method of claim 21, wherein adjusting the relative position of the measurement object and the other object comprises outputting a signal based on the contribution.

58. The method of claim 49, wherein adjusting the relative position of the measurement object and the other object comprises outputting a signal based on the contribution.

59. The method of claim 1, wherein measurement object or the other object are attached to a stage and adjusting the relative position comprises moving the stage.

60. The method of claim 7, wherein measurement object or the other object are attached to a stage and adjusting the relative position comprises moving the stage.

61. The method of claim 8, wherein measurement object or the other object are attached to a stage and adjusting the relative position comprises moving the stage.

62. The method of claim 12, wherein measurement object or the other object are attached to a stage and adjusting the relative position comprises moving the stage.

63. The method of claim 21, wherein measurement object or the other object are attached to a stage and adjusting the relative position comprises moving the stage.

64. The method of claim 49, wherein measurement object or the other object are attached to a stage and adjusting the relative position comprises moving the stage.

* * * * *